(12) United States Patent
Lee et al.

(10) Patent No.: US 10,325,802 B2
(45) Date of Patent: Jun. 18, 2019

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Ho In Lee, Suwon-si (KR); Dong Oh Kim, Daegu (KR); Seok Han Park, Hwaseong-si (KR); Chan Sic Yoon, Anyang-si (KR); Ki Wook Jung, Seoul (KR); Jinwoo Augustin Hong, Seoul (KR); Je Min Park, Suwon-si (KR); Ki Seok Lee, Hwaseong-si (KR); Ju Yeon Jang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 5 days.

(21) Appl. No.: 15/712,410

(22) Filed: Sep. 22, 2017

(65) Prior Publication Data
US 2018/0175038 A1 Jun. 21, 2018

(30) Foreign Application Priority Data

Dec. 21, 2016 (KR) ......................... 10-2016-0175247

(51) Int. Cl.
*H01L 21/762* (2006.01)
*H01L 27/108* (2006.01)
(Continued)

(52) U.S. Cl.
CPC ...... *H01L 21/762* (2013.01); *H01L 21/76834* (2013.01); *H01L 21/823462* (2013.01);
(Continued)

(58) Field of Classification Search
CPC . H01L 27/108; H01L 27/10844–10897; H01L 21/762–76205; H01L 29/0649
See application file for complete search history.

(56) References Cited

U.S. PATENT DOCUMENTS 6,118,167 A * 9/2000 DiSimone ......... H01L 21/76224
257/506
7,510,937 B2 3/2009 Takahashi
(Continued)

FOREIGN PATENT DOCUMENTS

KR 10-2011-0013033 A 2/2011
KR 10-2011-0067844 A 6/2011
(Continued)

*Primary Examiner* — Laura M Menz
*Assistant Examiner* — Candice Chan
(74) *Attorney, Agent, or Firm* — Lee & Morse, P.C.

(57) ABSTRACT

A method for fabricating a semiconductor device includes forming a device isolation film on a substrate between first and second regions, forming first and second sealing films, such that an etch selectivity of the second sealing film is smaller than that of the first sealing film, patterning the first and second sealing films to expose the second region and a portion of the device isolation film, such that an undercut is defined under a lower surface of the second sealing film, forming a filling film filling the undercut, a thickness of the filling film being thicker on a side surface of the second sealing film than on an upper surface thereof, removing a portion of the filling film to form a filling spacer in the undercut, forming a high-k dielectric film and a metal film on the filling spacer, and patterning the high-k dielectric film and the metal film.

20 Claims, 20 Drawing Sheets

(51) Int. Cl.
  *H01L 21/768* (2006.01)
  *H01L 21/8234* (2006.01)
  *H01L 29/66* (2006.01)
  *H01L 29/786* (2006.01)
  *H01L 27/12* (2006.01)
  *H01L 29/43* (2006.01)
  *H01L 29/06* (2006.01)

(52) U.S. Cl.
  CPC ........ *H01L 21/823468* (2013.01); *H01L 27/10823* (2013.01); *H01L 27/1248* (2013.01); *H01L 29/0649* (2013.01); *H01L 29/432* (2013.01); *H01L 29/6656* (2013.01); *H01L 29/6659* (2013.01); *H01L 29/7869* (2013.01)

(56) References Cited

U.S. PATENT DOCUMENTS

| | | | |
|---|---|---|---|
| 7,768,052 B1 | 8/2010 | Carns et al. | |
| 8,093,594 B2 | 1/2012 | Choung et al. | |
| 2015/0303201 A1 | 10/2015 | Lee et al. | |
| 2016/0099155 A1* | 4/2016 | Park | H01L 21/3081 |
| | | | 438/294 |

FOREIGN PATENT DOCUMENTS

| | | |
|---|---|---|
| KR | 10-2014-0100647 A | 8/2014 |
| KR | 10-2015-0121767 A | 10/2015 |

* cited by examiner

METHOD FOR FABRICATING SEMICONDUCTOR DEVICE

CROSS-REFERENCE TO RELATED APPLICATION

Korean Patent Application No. 10-2016-0175247, filed on Dec. 21, 2016, in the Korean Intellectual Property Office, and entitled: "Method for Fabricating Semiconductor Device," is incorporated by reference herein in its entirety.

BACKGROUND

1. Field

The present disclosure relates to a method for fabricating a semiconductor device.

2. Description of the Related Art

In a memory device such as a conventional dynamic random access memory (DRAM), there is a heterojunction interface between a silicon nitride film as a buffer and a silicon oxide film when these films are used for sealing of a cell array region. However, due to etch selectivity of the heterojunction interface, an undercut may occur by a subsequent cleaning or etching process.

SUMMARY

According to an aspect of embodiments, there is provided a method for fabricating a semiconductor device, including providing a substrate including a first region and a second region, forming a device isolation insulating film between the first region and the second region, forming a first sealing film on the substrate, forming a second sealing film on the first sealing film, wherein etch selectivity of the second sealing film is smaller than that of the first sealing film, patterning the first and second sealing films and exposing all of the second region and a portion of the device isolation insulating film, wherein the first sealing film is removed more than the second sealing film, thus forming an undercut on a lower portion of the second sealing film, forming a filling film filling the undercut and covering the first and second regions, wherein a thickness of the filling film is thicker on a side surface of the second sealing film than on an upper surface of the second sealing film, forming a filling spacer filling the undercut by removing a portion of the filling film, forming a high-k dielectric film and a metal film on the filling spacer and removing the high-k dielectric film and the metal film.

According to another aspect of embodiments, there is provided a method for fabricating a semiconductor device, including providing a substrate including a cell array region and a periphery region, wherein the substrate includes a buried gate structure on the cell array region, forming a device isolation insulating film between the cell array region and the periphery region, forming a sealing film covering the cell array region and exposing the periphery region, wherein the sealing film includes a first sealing film and a second sealing film formed on the first sealing film, and forming an undercut under the second sealing film on a side surface of the first sealing film, forming a filling film filling the undercut, wherein a thickness of the filling film is thicker on a side surface of the second sealing film than an upper surface of the second sealing film, forming a filling spacer by removing a portion of the filling film without removing a first filling film filling the undercut, forming a gate insulating film, a high-k dielectric film, and a metal film sequentially on the periphery region and the filling spacer and forming a stack gate structure on the periphery region by patterning the gate insulating film, the high-k dielectric film and the metal film, wherein the high-k dielectric film and the metal film on the filling spacer are removed.

According to still another aspect of embodiments, there is provided a method for fabricating a semiconductor device, including providing a substrate including a cell array region and a periphery region, wherein the periphery region includes first and second conductive regions having different conductivity types, forming a device isolation insulating film between the cell array region and the periphery region, forming a sealing film covering the cell array region and exposing the periphery region, wherein the sealing film includes a first sealing film and a second sealing film formed on the first sealing film, and an undercut is formed on a side surface of the first sealing film and under the second sealing film, forming a filling film filling the undercut, forming a filling spacer filling the undercut by removing a portion of the filling film, exposing the second conductive region by removing other portion of the filling film, forming a conductive channel region including a different material from the substrate of the second conductive region and forming a gate insulating film, a high-k dielectric film and a metal film sequentially on the filling spacer.

According to still another aspect of embodiments, there is provided a method for fabricating a semiconductor device, including forming a device isolation trench between a cell array region and a periphery region, forming a device isolation insulating film filling the device isolation trench, wherein the device isolation insulating film includes a first insulating film formed along a side surface and a bottom surface of the device isolation trench, a second insulating film formed on the first insulating film, and a third insulating film entirely filling the device isolation trench on the second insulating film, forming a sealing film covering the cell array region, exposing the periphery region, and having an undercut on the device isolation insulating film, forming a filling film filling the undercut and forming a filling spacer filling the undercut on the device isolation insulating film by removing a portion of the filling film.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, a method for fabricating a semiconductor device according to some exemplary embodiments will be described with reference to FIGS. 1 to 18.

Figure 1:
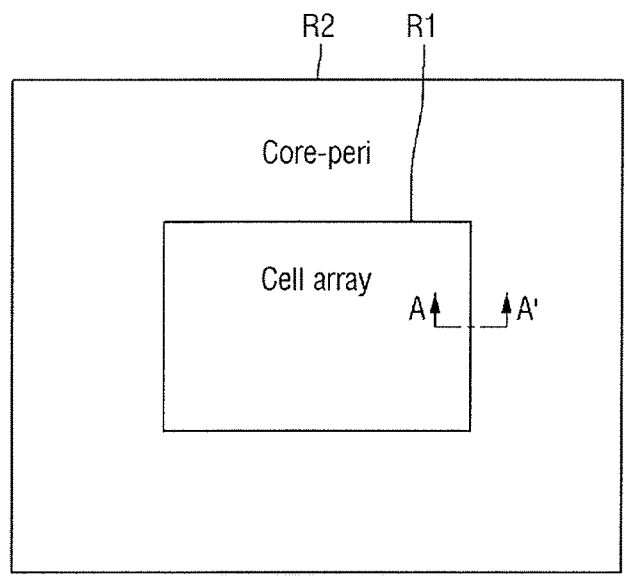
FIGS. 1 to 18 illustrate views of intermediate stages in a method for fabricating a semiconductor device according to some exemplary embodiments.
Figure 1:
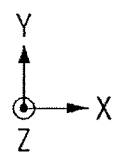

FIGS. 1 to 18 are views illustrating intermediate stages in a method for fabricating a semiconductor device according to some exemplary embodiments. In detail, FIG. 1 is a top view provided to explain a method for fabricating a semiconductor device according to some exemplary embodiments, and FIGS. 2 to 11 and 13 to 18 are cross sectional views taken along line A-A' of FIG. 1. FIG. 12 is an enlarged cross-sectional view of the encircled section B of FIG. 11.

Figure 2:
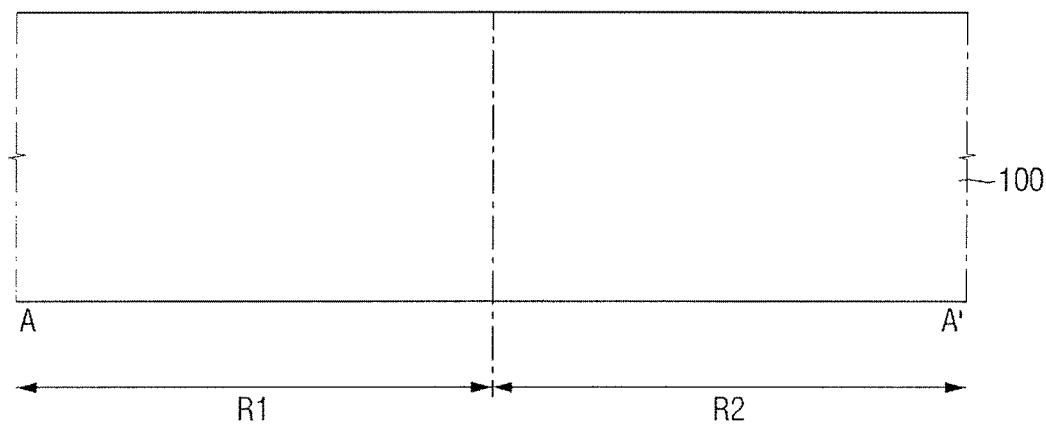

Referring to FIGS. 1 and 2, a substrate 100 is provided. The substrate 100 may be, e.g., a bulk silicon or a silicon-on-insulator (SOI). Alternatively, the substrate 100 may be a silicon substrate, or may include other materials, e.g., silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The substrate 100 may include a first region R1 and a second region R2. The first region R1 may be surrounded by the second region R2. In detail, the second region R2 may surround the first region R1 in a plan view of a horizontal plane formed by a first direction X and a second direction Y. That is, the second region R2 may surround, e.g., an entire perimeter of, the first region R1. The first region R1 may be a cell array region. The second region R2 may be a periphery region or a core-peri region. The first region R1 may be a region in which memory cells of a memory device are arranged. The second region R2 may be a region surrounding the memory cell region and where transistors to control operation of the memory cells are formed.

Figure 3:
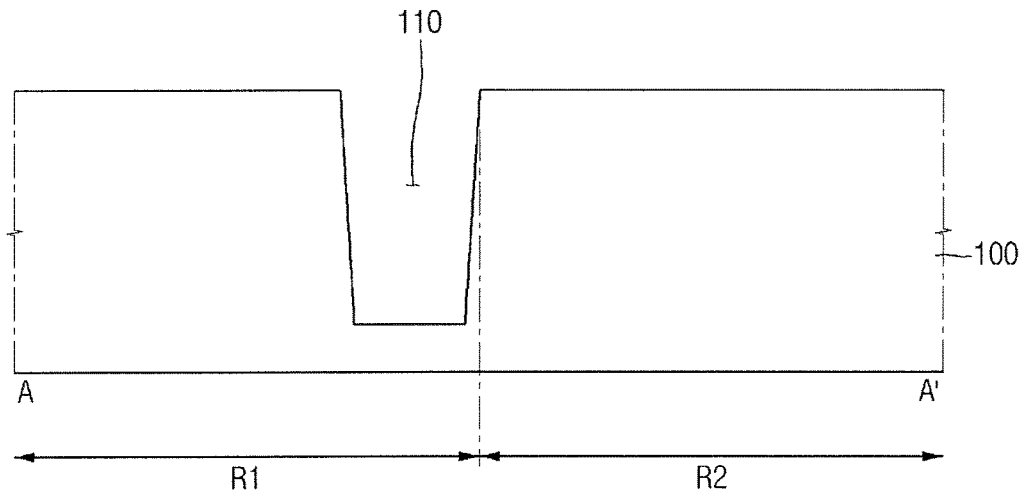

Next, referring to FIG. 3, a first device isolation trench 110 may be formed between the first region R1 and the second region R2 of the substrate 100. Although FIG. 3 illustrates that the first device isolation trench 110 is included in the first region R1, exemplary embodiments are not limited thereto. That is, the first device isolation trench 110 may be formed across a boundary of the first region R1 and the second region R2, or rather, formed in the second region R2 so as to be in contact with a boundary of the first region R1 and the second region R2.

Such formation is based on the fact that the boundary is defined with a virtual boundary line, not that a boundary of the first region R1 and the second region R2 is clearly defined. That is, the first device isolation trench 110 may be formed between an inner portion (spaced from a boundary) of the first region R1 and an inner portion (spaced from a boundary) of the second region R2.

Figure 4:
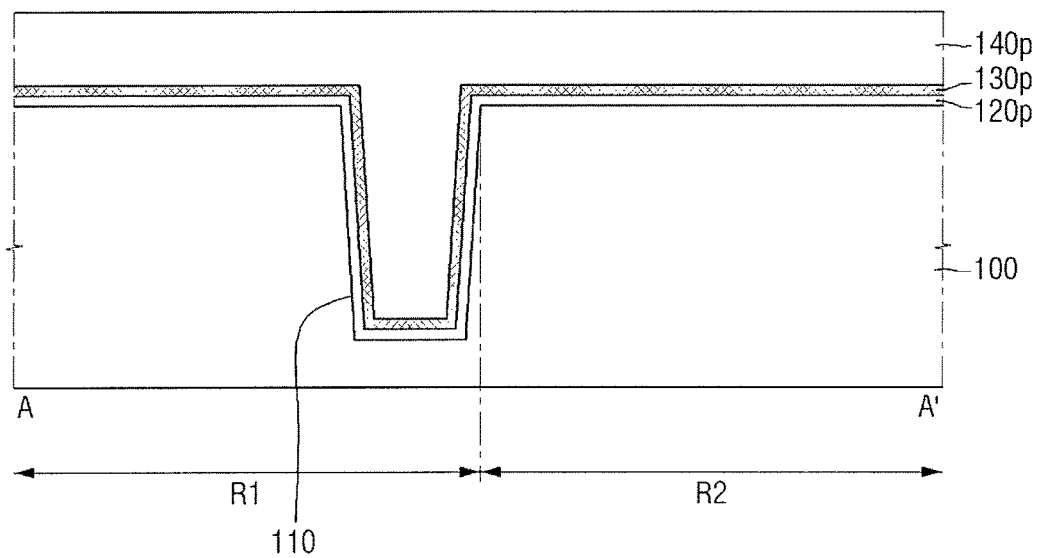

Next, referring to FIG. 4, a first pre insulating film 120p, a second pre insulating film 130p, and a third pre insulating film 140p may be sequentially formed on the substrate 100. For example, as illustrated in FIG. 4, the first and second pre insulating films 120p and 130p may be conformal along the upper surface of the substrate 100 and along the sidewalls and bottom of the first device isolation trench 110.

In detail, the first pre insulating film 120p may be formed. The first pre insulating film 120p may be formed along a bottom surface and a side surface of the first device isolation trench 110. The first pre insulating film 120p may be also formed along an upper surface of the substrate 100 in the first region R1 and the second region R2. The first pre insulating film 120p may become the first insulating film 120 by a subsequent patterning process.

Next, the second pre insulating film 130p may be formed. The second pre insulating film 130p may be formed on the first pre insulating film 120p. In detail, the second pre insulating film 130p may be formed on the first pre insulating film 120p, along a bottom surface and a side surface of the first device isolation trench 110. The second pre insulating film 130p may be formed on the first pre insulating film 120p along the upper surface of the substrate 100. That is, the second pre insulating film 130p may be formed along an upper surface of the first pre insulating film 120p.

In an example, the first pre insulating film 120p and the second pre insulating film 130p are in a liner shape, which may not entirely fill the first device isolation trench 110.

Then, the third pre insulating film 140p may be formed. The third pre insulating film 140p may be formed on the second pre insulating film 130p. The third pre insulating film 140p may entirely fill the first device isolation trench 110. The third pre insulating film 140p may entirely cover an upper surface of the second pre insulating film 130p. The third pre insulating film 140p may also cover an upper surface of the second pre insulating film 130p on the substrate 100 after entirely filling the first device isolation trench 110.

The first pre insulating film 120p and the second pre insulating film 130p may include different materials from each other. For example, the first pre insulating film 120p may include silicon oxide, and the second pre insulating film 130p may include a silicon nitride film. The first pre insulating film 120p may be formed so as to repair an interface damaged caused by an etch process. The first pre insulating film 120p may be formed by an oxidation process or a deposition process. Then, the second pre insulating film 130p may be formed by a deposition process. Because the first pre insulating film 120p and the second pre insulating film 130p include different materials from each other, durability of a continuation of the films formed within the first device isolation trench 110 in a subsequent process may be increased, and stress characteristic applied to an active region of the substrate 100 may be enhanced.

The third pre insulating film 140p may include a material having a lower gap fill capability than a material of the first pre insulating film 120p. However, exemplary embodiments are not limited to the example given above. For example, the third pre insulating film 140p may include at least one of silicon oxide, silicon nitride, silicon oxynitride, and a low-k dielectric material with a smaller dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited hereto.

Figure 5:
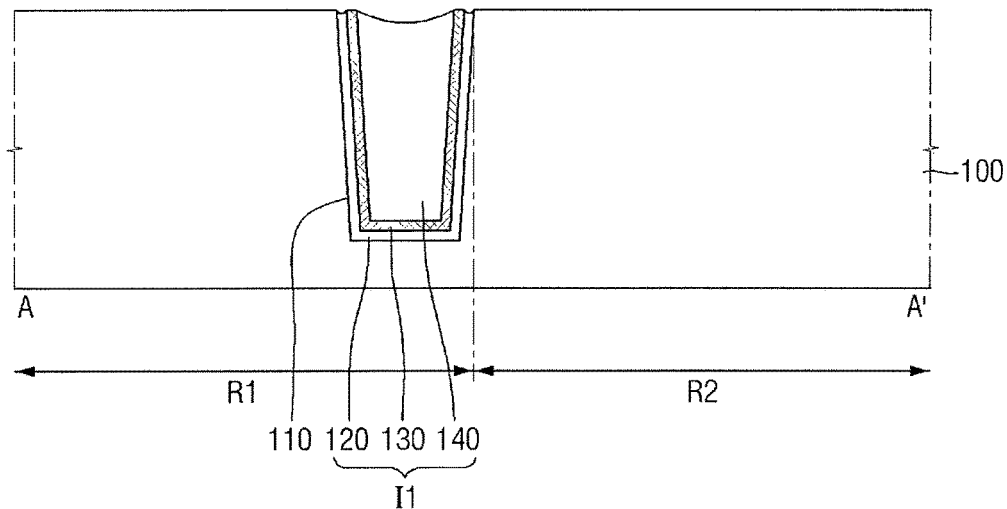

Next, referring to FIG. 5, a first device isolation insulating film I1 filling, e.g., accommodated in, the first device isolation trench 110 may be formed.

The first device isolation insulating film I1 may include a first insulating film 120, a second insulating film 130, and a third insulating film 140. The first insulating film 120 may be formed by patterning the first pre insulating film 120p, the second insulating film 130 may be formed by patterning the second pre insulating film 130p, and the third insulating film 140 may be formed by patterning the third pre insulating film 140p, respectively. That is, with a planarization process or an etch process, only the first device isolation insulating film I1 filling the first device isolation trench 110 may remain, and the rest of the upper surface of the substrate 100 may be exposed.

The first insulating film 120 and the third insulating film 140 may have lower upper surfaces than the second insulating film 130, e.g., an upper surface of the second insulating film 130 may be higher than those of the first and third insulating films 120 and 140 relatively to the bottom of the first device isolation trench 110. This is due to the fact that the first insulating film 120 and the third insulating film 140 have higher etch selectivity than the second insulating film 130.

Accordingly, the upper surfaces of the first insulating film 120 and the third insulating film 140 may have a concave shape. In detail, because a width of the third insulating film 140 is wider than that of the first insulating film 120, the degree of concavity of the third insulating film 140 may be greater than that of the first insulating film 120. An upper surface of the third insulating film 140 may become higher with a decreasing distance to the second insulating film 130, and become lower with an increasing distance from the second insulating film 130, e.g., the upper surface of the third insulating film 140 may curve inwardly toward the bottom of the first device isolation trench 110.

Figure 6:
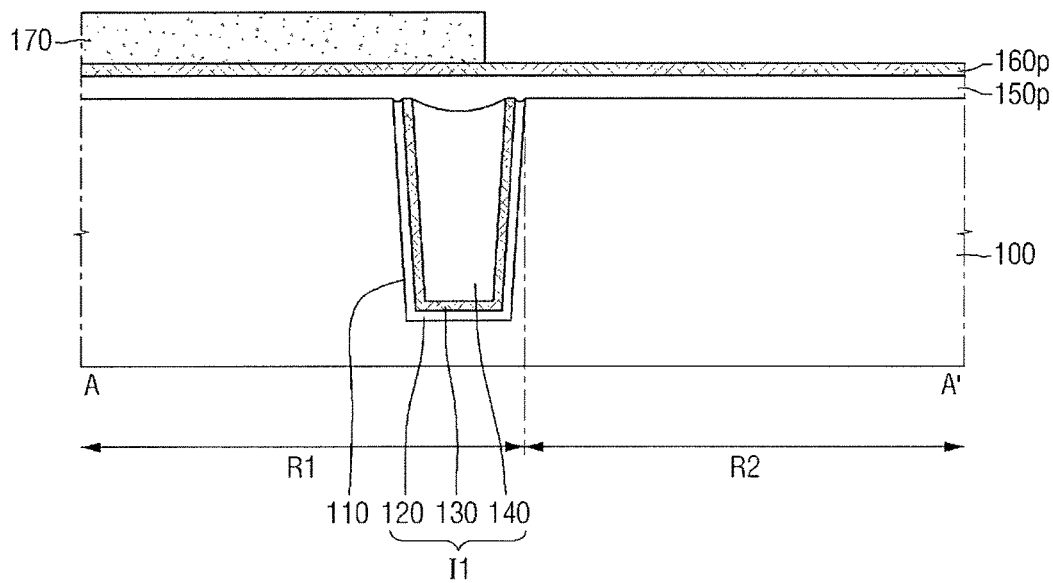

Next, referring to FIG. 6, a first pre sealing film 150p, a second pre sealing film 160p, and a barrier film 170 may be formed on the substrate 100.

In detail, the first pre sealing film 150p may be formed on upper surfaces of the first region R1 and the second region R2 of the substrate 100. Further, the first pre sealing film 150p may also be formed on the first device isolation insulating film I1. Although the drawings illustrate that a lower surface of the first pre sealing film 150p is bent and an upper surface thereof is flat, exemplary embodiments are not limited thereto. That is, the upper surface of the first pre sealing film 150p may be formed to be bent as the lower surface thereof.

Next, the second pre sealing film 160p may be formed along the upper surface of the first pre sealing film 150p on the first pre sealing film 150p. The second pre sealing film 160p on the first pre sealing film 150p may entirely cover the first region R1 and the second region R2 of the substrate 100.

The first pre sealing film 150p and the second pre sealing film 160p may have different materials from each other. The first pre sealing film 150p and the second pre sealing film 160p may have different etch selectivities in the etch process to be described below. The etch selectivity may be varied with the etchant, i.e., etch solution or etch gas. However, in the method for fabricating a semiconductor device according to some exemplary embodiments, the etch selectivity of the first pre sealing film 150p may be relatively greater than the etch selectivity of the second pre sealing film 160p. For example, the first pre sealing film 150p may include silicon oxide, and the second pre sealing film 160p may include silicon nitride.

Next, the barrier film 170 may be formed on an upper surface of the second pre sealing film 160p. The barrier film 170 may be formed only on the first region R1 and may expose the second region R2 of the substrate 100. The barrier film 170 may be formed to cover at least a portion of the first device isolation insulating film H. Accordingly, an end of the barrier film 170 may overlap an upper surface of the first device isolation insulating film I1, e.g., a lateral sidewall of the barrier film 170 may be positioned on and overlap the upper surface of the first device isolation insulating film I1.

The barrier film 170 may include a material having a, e.g., very, low etch selectivity with respect to all of the first pre sealing film 150p and the second pre sealing film 160p. For example, the barrier film 170 may be a spin on hardmask (SOH) or carbon based material, but is not limited hereto. Accordingly, the barrier film 170 may protect the first pre sealing film 150p and the second pre sealing film 160p on the first region R1, while the first pre sealing film 150p and the second pre sealing film 160p in the second region R2 are removed by a subsequent etch process.

Figure 7:
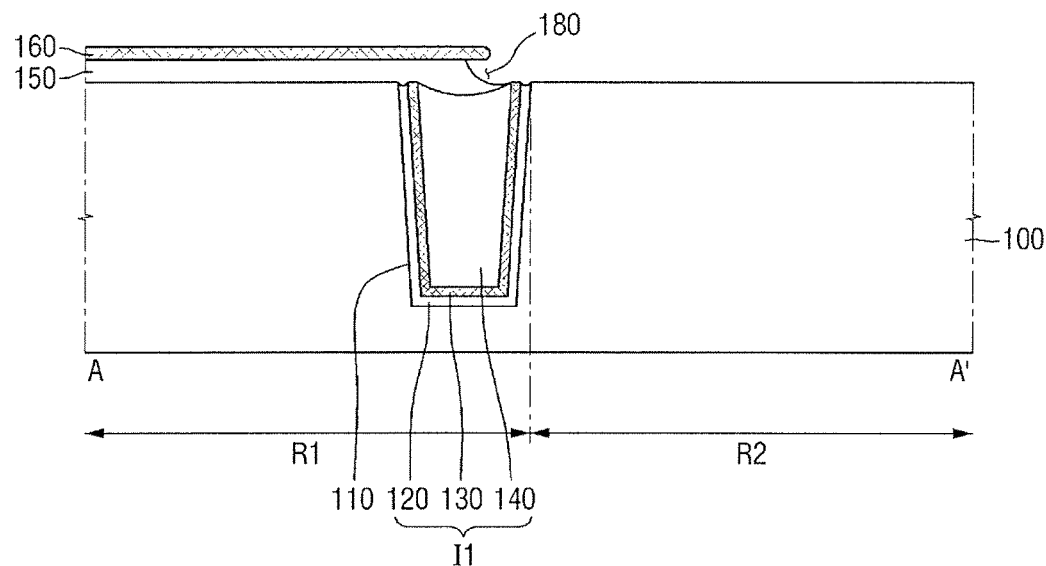

Next, referring to FIG. 7, a first sealing film 150 and a second sealing film 160 are formed by removing a portion of the first pre sealing film 150p and the second pre sealing film 160p. A portion of the first pre sealing film 150p and the second pre sealing film 160p may be removed by using the barrier film 170 as a mask. By doing so, the first pre sealing film 150p may be formed into the first sealing film 150 and the second pre sealing film 160p may be formed into the second sealing film 160.

The first sealing film 150 and the second sealing film 160 may cover an upper surface of the first region R1 of the substrate 100, while exposing an upper surface of the second region R2. Accordingly, the first sealing film 150 and the second sealing film 160 may perform the sealing of the first region R1.

The first sealing film 150 and the second sealing film 160 may cover the upper surface of the first device isolation insulating film I1. However, the entire upper surface of the first device isolation insulating film I1 may not be necessarily covered. That is, at least a portion of the first device isolation insulating film I1 may be covered. Because a purpose of the first sealing film 150 and the second sealing film 160 is to seal the first region R1 and to expose the second region R2, the upper surface of the first device isolation insulating film I1 may be at least partially covered. Although the drawings illustrate that the first sealing film 150 entirely covers the third insulating film 140 of the first device isolation insulating film I1, exemplary embodiments are not limited thereto.

Meanwhile, as described above, because the etch selectivity is different in the second sealing film 160 and the first sealing film 150, a first undercut 180 may be formed under a lower portion of the second sealing film 160 and a side surface of an end of the first sealing film 150, e.g., a first undercut region may be defined between the first and second sealing films 150 and 160. A portion of the lower portion of the second sealing film 160 may be exposed by the first undercut 180, e.g., the first sealing film 150 may be etched faster that the second sealing film 160 to expose a portion of the lower surface of the second sealing film 160.

The barrier film 170 may then be removed. The barrier film 170 may be removed by, e.g., ashing, but is not limited hereto.

Figure 8:
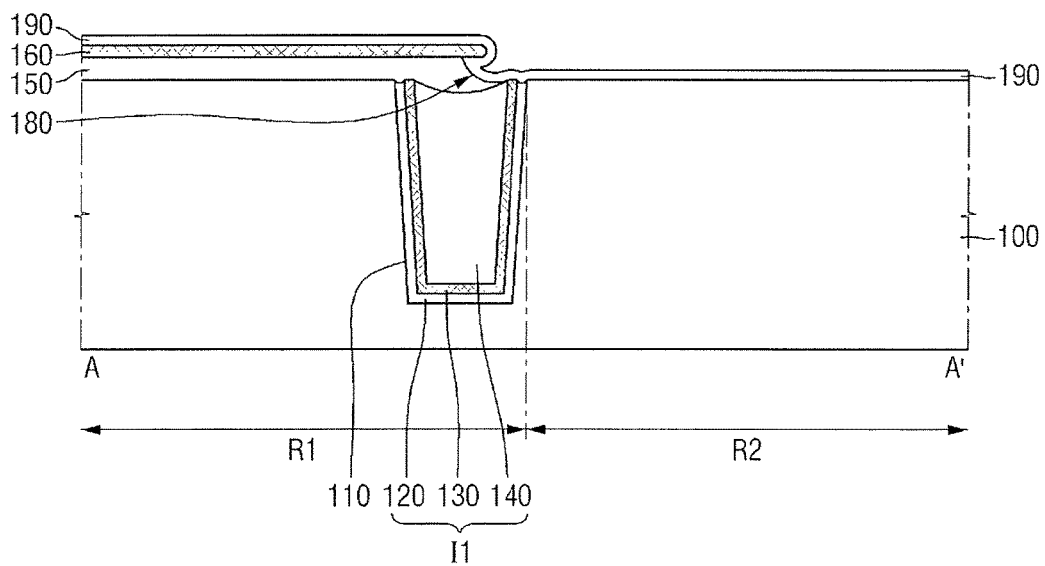

Next, referring to FIG. 8, a first filling film 190 is formed on the substrate 100. For example, as illustrated in FIG. 8, the first filling film 190 may be formed conformally along lateral sidewalls of the first and second sealing films 150 and 160, and along an exposed upper surface of the first device isolation insulating film I1.

In detail, the first filling film 190 may be formed along an upper surface and a side surface of the second sealing film 160, a side surface of the first sealing film 150, and the substrate 100 of the second region R2. The first filling film 190 may be formed along a bottom surface of the first undercut 180. Accordingly, the first filling film 190 may fill at least a portion of the first undercut 180. Further, the first filling film 190 may cover all of an upper surface, a side surface, and a lower surface of the second sealing film 160. For this purpose, the first filling film 190 may include a material having good gap fill capability. For example, the first filling film 190 may include silicon oxide.

The first filling film 190 may play a role of a buffer layer of a conductive channel region 220 to be formed later in a p-type region (Rp of FIG. 11) of the second region R2, which will be descried below. This will be explained below.

Figure 9:
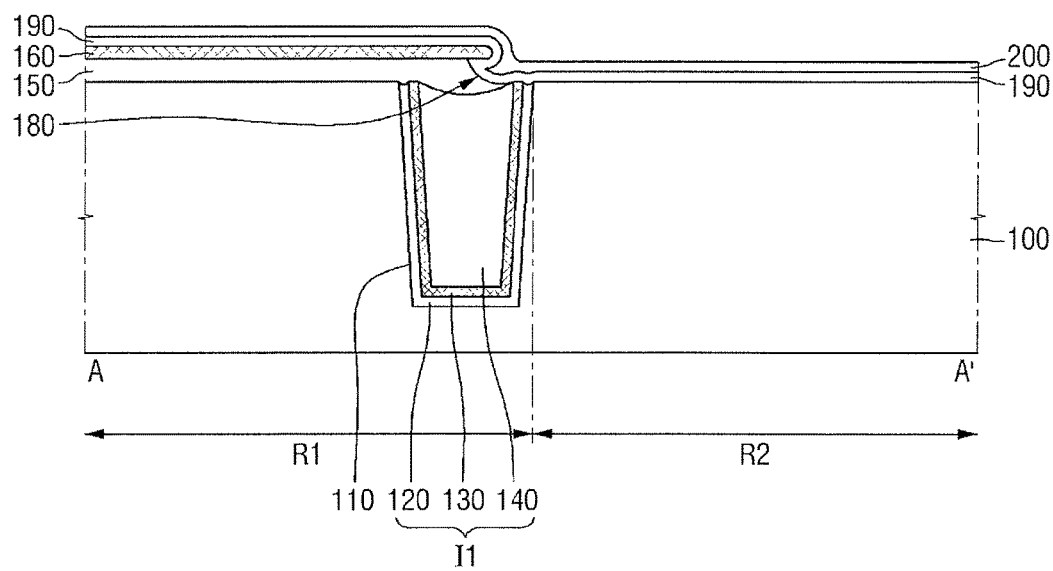

Next, referring to FIG. 9, a second filling film 200 is formed, e.g., conformally, on the first filling film 190.

In detail, the second filling film 200 may be formed along an upper surface of the first filling film 190. The first undercut 180 may be entirely filled by the second filling film 200. Alternatively, the first undercut 180 may have been already entirely filled by the first filling film 190.

The second filling film 200 may include a different material from the first filling film 190, or a same material as the first filling film 190. The second filling film 200 may include a material with good gap fill capability as in the first filling film 190. For example, the second filling film 200 may include silicon oxide, silicon nitride, or silicon oxynitride.

Figure 10:
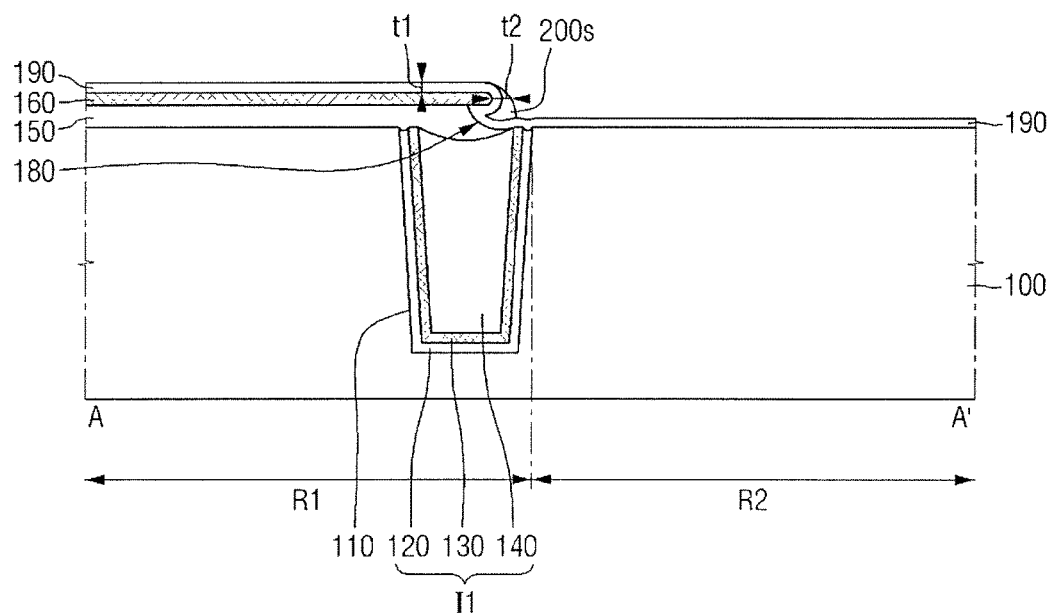

Next, referring to FIG. 10, a pre filling spacer 200s is formed. The second filling film 200 may be etched to form the pre filling spacer 200s.

In detail, the second filling film 200 may be entirely removed except for the pre filling spacer 200s and a channel region spacer 200p. However, exemplary embodiments are not limited to the example given above.

In an example, a process of etching the second filling film 200 may be anisotropic etch. For example, a process of etching the second filling film 200 may be dry etch.

The pre filling spacer 200s may fill the first undercut 180. With the pre filling spacer 200s, a thickness of the filling film formed on an upper surface of the second sealing film 160 may be a first thickness t1, and a thickness of the filling film formed on a side surface of the second sealing film 160 may be a second thickness t2. In this case, the first thickness t1 may be smaller than the second thickness t2.

Figure 11:
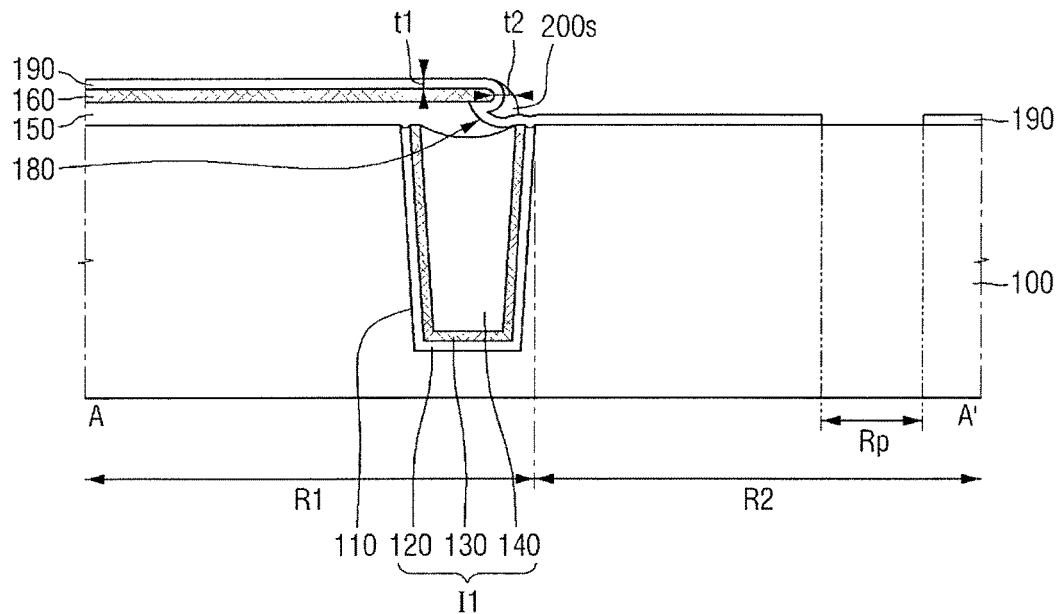
Figure 12:
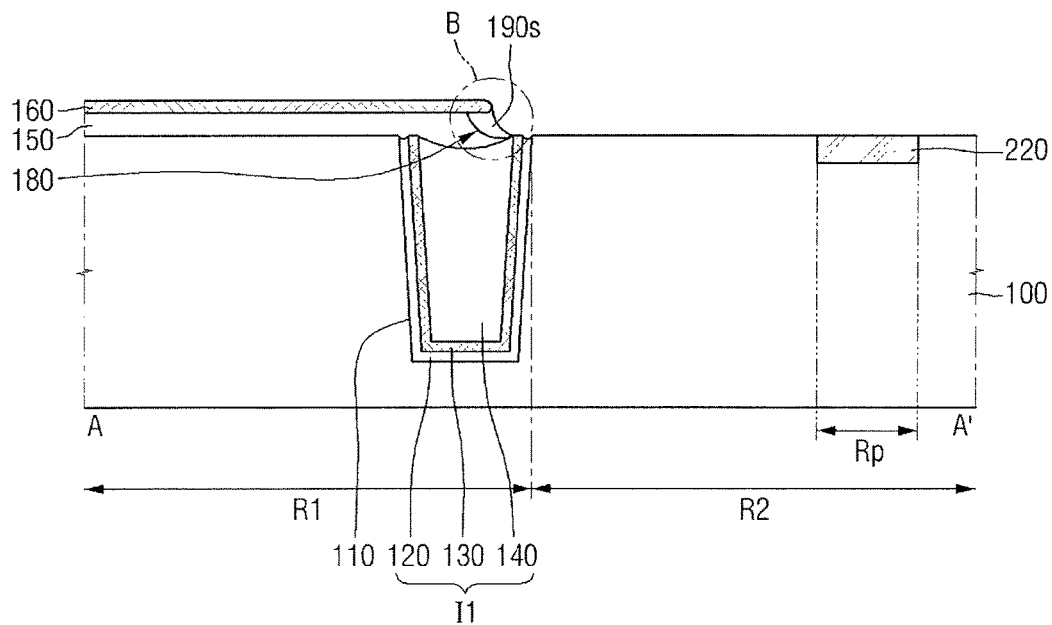

Next, referring to FIG. 11, the first filling film 190 formed on the upper surface of the p-type region Rp of the second region R2 may be removed. Accordingly, an upper surface of the p-type region Rp in the second region R2 of the substrate 100 may be exposed. The conductive channel region 220 may be formed later on the pbbtype region Rp.

Figure 13:
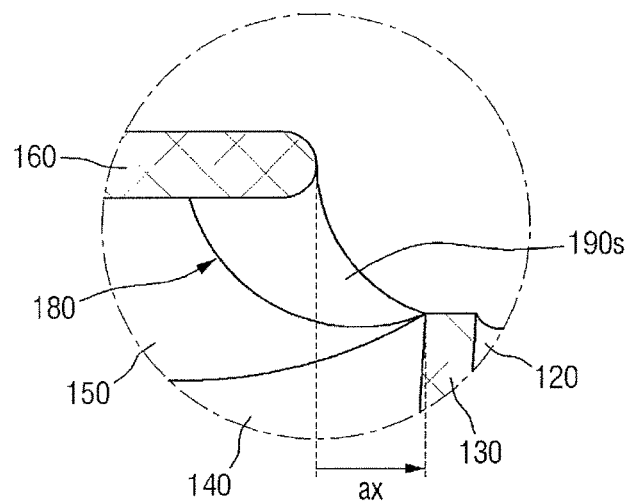
Figure 14:
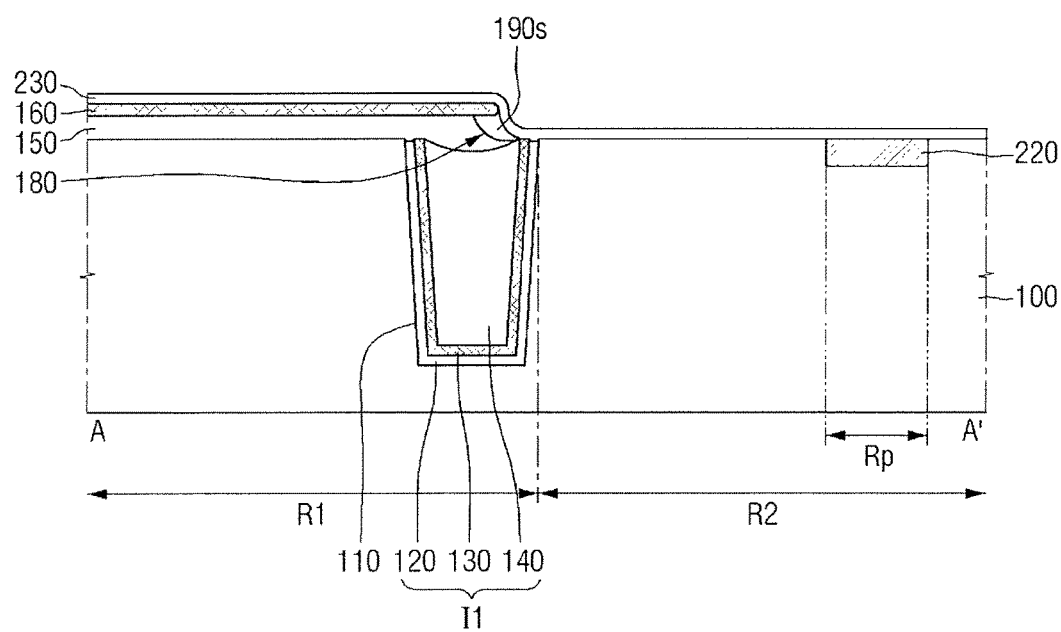

Referring to FIGS. 12 and 13, a filling spacer 190s and the conductive channel region 220 may be formed. First, the conductive channel region 220 may be formed.

The conductive channel region 220 may be formed on the p-type region Rp of the second region R2 of the substrate 100. The conductive channel region 220 may be formed on the p-type region Rp. The conductive channel region 220 may be formed to form a p-type transistor.

In detail, the conductive channel region 220 may be formed so as to form a channel region of the transistor formed on the p-type region Rp with silicon germanium (SiGe). That is, the conductive channel region 220 may include silicon germanium.

The conductive channel region 220 may be formed to be a SiGe layer while consuming, e.g., using, silicon of the exposed p-type region Rp. In an example, a form of the SiGe layer may be fabricated with the epitaxial growth.

Next, the filling spacer 190s may be formed. The filling spacer 190s may be formed by wet etch.

The filling spacer 190s may fill the first undercut 180. The filling spacer 190s may be an unremoved portion of the first filling film 190. The filling spacer 190s may cover all of a lower surface and a portion of a side surface of the second sealing film 160, and a side surface of the first sealing film 150.

Although the drawings illustrate that the filling spacer 190s does not cover upper surfaces of the second insulating film 130 and the third insulating film 140, exemplary embodiments are not limited thereto. The position of the filling spacer 190s may not be limited as long as the first undercut 180 is filled.

A profile of an upper surface of the filling spacer 190s may correspond one to one in a direction from the first region R1 to the second region R2, i.e., along a straight line ax extending in the first direction X. In an example, the expression "correspond one to one" means that there is only one dot that forms a profile of the upper surface of the filling spacer 190s corresponding to a vertical direction (third direction Z) on a coordinate of dots forming the straight line ax. As a result, this indicates that the profile of the upper surface of the filling spacer 190s is not formed to be concave as in the first undercut 180.

The shape of the filling spacer 190s may prevent a material formed later from being remained. A relevant description will be further explained below. Next, referring to FIG. 14, a gate insulating film 230 is formed.

The gate insulating film 230 may be formed on both of the first region R1 and the second region R2. The gate insulating film 230 may be formed along an upper surface of the second sealing film 160, an upper surface of the filling spacer 190s, and the upper surface of the substrate 100 on the second region R2. In an example, the gate insulating film 230 may be also formed on upper surfaces of the exposed first insulating film 120, second insulating film 130, and third insulating film 140. Further, the gate insulating film 230 may be formed on the conductive channel region 220.

The gate insulating film 230 may be, e.g., a silicon oxide film. The gate insulating film 230 may be used later as an insulating film formed on a lower portion of a gate electrode of the transistor.

Figure 15:
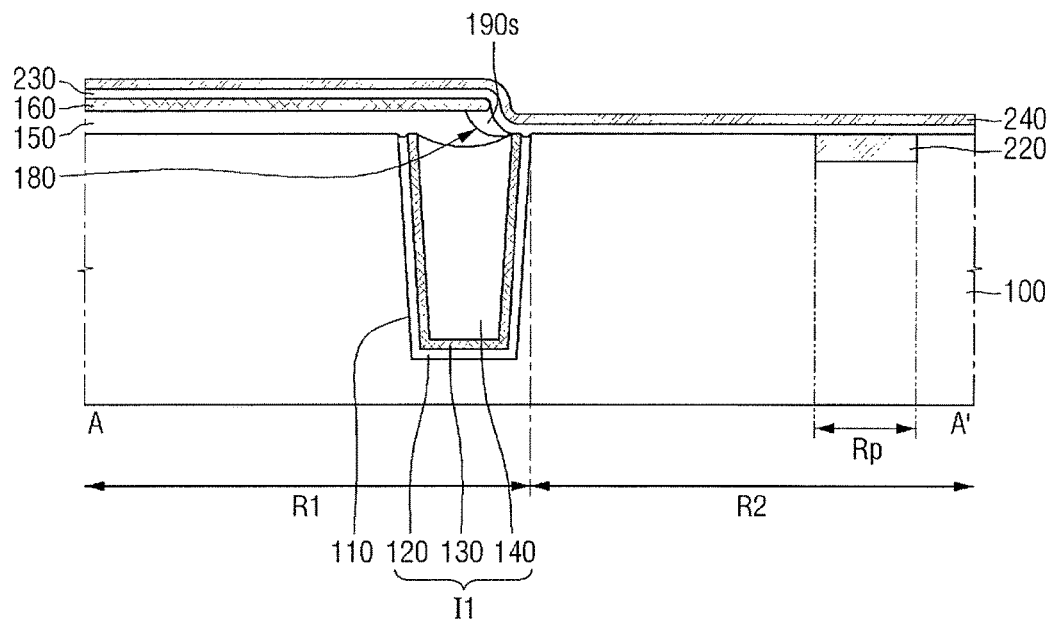

Next, referring to FIG. 15, a high-k dielectric film 240 may be formed on the gate insulating film 230.

The gate insulating film 230 may be formed on both of the first region R1 and the second region R2. The high-k dielectric film 240 may be formed along an upper surface of the gate insulating film 230. The high-k dielectric film 240 may include a high-k dielectric material with a higher dielectric constant than a silicon oxide film.

For example, the high-k dielectric film 240 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but not limited hereto.

Figure 16:
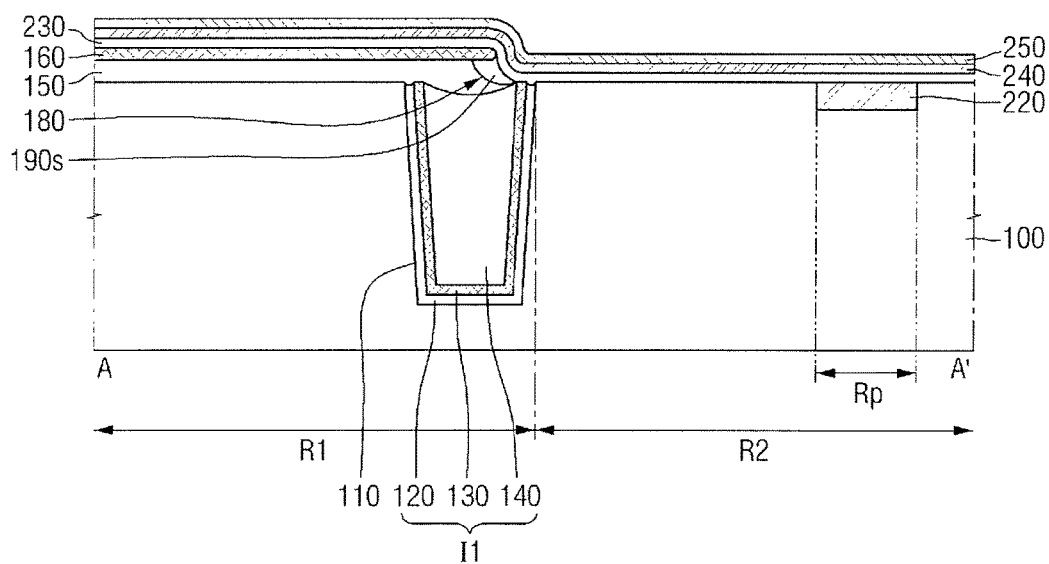

Next, referring to FIG. 16, a metal film 250 may be formed on the high-k dielectric film 240.

The metal film 250 may be formed on both of the first region R1 and the second region R2. The metal film 250 may be combined with the high-k dielectric film 240 to form a high-k metal gate (HKMG). The high-k metal gate (HKMG) may reduce leakage and enhance a dielectric constant. Further, for the high-k metal gate (HKMG), the metal film 250 may be used instead of a poly silicon film so as to assist fermi-level pinning and to adjust a gate to low threshold voltages. Such high-k metal gate may allow smaller scaling of the transistor as well as standby power saving with reduction of gate leakage.

Figure 17:
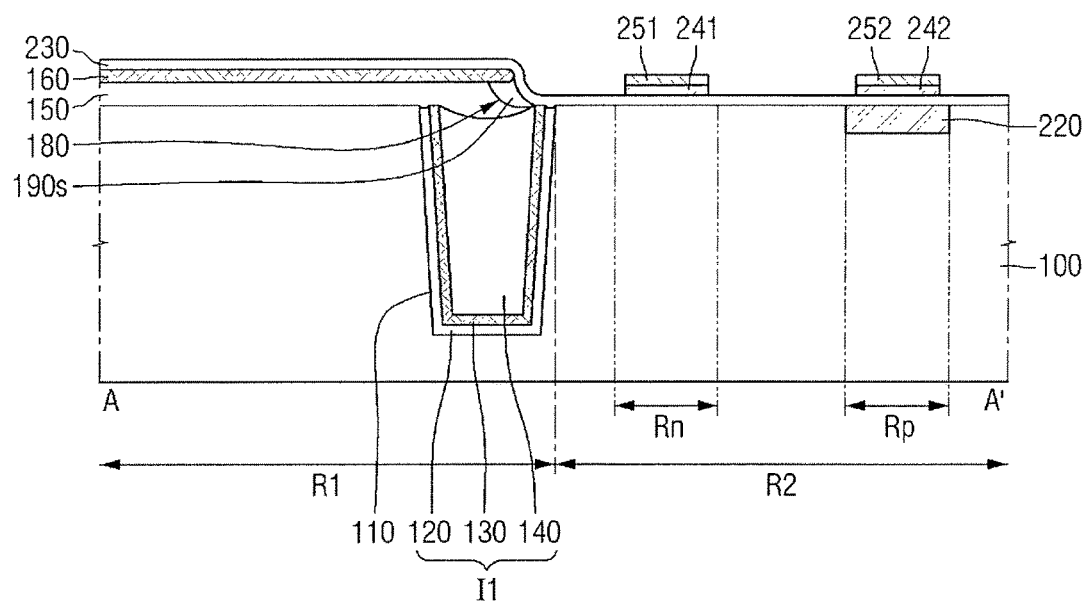

Next, referring to FIG. 17, the high-k dielectric film 240 and the metal film 250 may be patterned.

The high-k dielectric film 240 and the metal film 250 may be removed except for the p-type region Rp and the n-type region Rn. In an example, the p-type region Rp may be a region where the p-type transistor may be formed according to a subsequent process, and the n-type region Rn may be a region where the n-type transistor may be formed according to a subsequent process. Although drawings illustrate that the n-type region Rn is nearer to the first region R1 than the p-type region Rp, exemplary embodiments are not limited thereto. Arrangement of the n-type region Rn and the p-type region Rp may be changed without limitation according to a purpose and a reason of a process.

The high-k dielectric film 240 may be patterned into a first high-k dielectric film 241 in the n-type region Rn, and patterned into a second high-k dielectric film 242 in the p-type region Rp. The metal film 250 may be patterned into a first metal film 251 in the n-type region Rn, and may be patterned into a second metal film 252 in the p-type region Rp.

Meanwhile, remnants of the high-k dielectric film 240 and the metal film 250 may not remain at all on the gate insulating film 230 of the filling spacer 190s. This is due to the fact that the first undercut 180 was filled with the filling spacer 190s. That is, if the first undercut 180 were not completely filled with the filling spacer 190s according to embodiments, remains of the high-k dielectric film 240 and the metal film 250 could have remained in the first undercut 180 as a stringer, thereby potentially causing contamination in a subsequent process.

In contrast, the method for fabricating a semiconductor device according to some exemplary embodiments includes completely filling the first undercut 180 with the filling spacer 190s. Accordingly, no portions of the high-k dielectric film 240 and the metal film 250 may remain in the first undercut 180 or on the gate insulating film 230 after etching, thereby preventing or substantially minimizing contamination and improving the operating performance.

Figure 18:
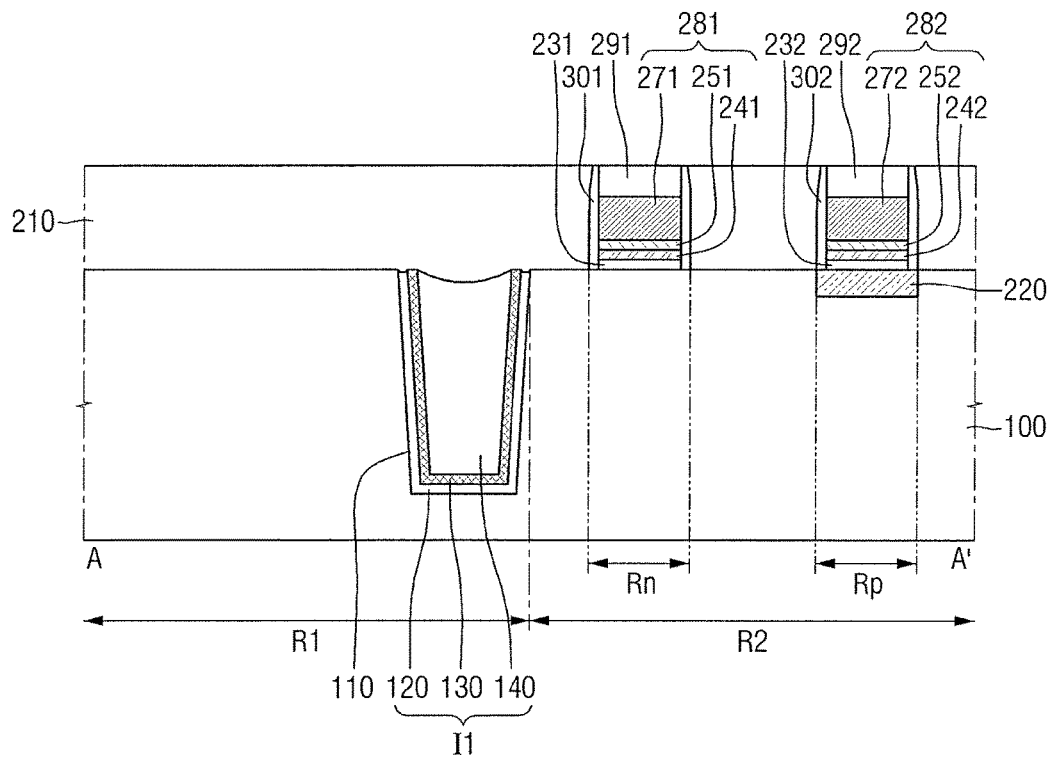

Next, referring to FIG. 18, a first gate electrode 281, a second gate electrode 282, a first gate spacer 301, a second gate spacer 302, an interlayer insulating film, and so on may be formed.

The first gate electrode 281 may include the first high-k dielectric film 241, the first metal film 251, and a first conductive film 271, which are described above. The first gate electrode 281 may be formed on the first gate insulating film 231. In an example, the first gate insulating film 231 may be formed by patterning the gate insulating film 230.

The first conductive film 271 may be formed in a stack structure of various conductors. Alternatively, the first conductive film 271 may be formed as a single film. The first conductive film 271 may include metal, e.g., tungsten. However, exemplary embodiments are not limited to the example given above.

A first capping film 291 may be formed on the first conductive film 271. The first capping film 291 may entirely cap the first conductive film 271. The first capping film 291 may include an insulator. For example, the first capping film 291 may be any one of silicon nitride, silicon oxide, and silicon oxynitride. However, exemplary embodiments are not limited to the example given above.

The first gate spacer 301 may be formed on both sides of the first gate insulating film 231, the first gate electrode 281, and the first capping film 291. As exemplified in the drawings, the first gate spacer 301 may be a single film, but it may be multiple spacers in which a plurality of films are stacked. A shape of the first gate spacer 301 and a shape of each of the multiple spacers forming the first gate spacer 301 may be I- or L-shape, or a combination thereof depending on the fabrication process and use.

Likewise, the second gate electrode 282 may include a second high-k dielectric film 242, a second metal film 252, and a second conductive film 272, which are described above. The second gate electrode 282 may be formed on the second gate insulating film 232. At this time, the second gate insulating film 232 may be formed by patterning the gate insulating film 230.

The second conductive film 272 may be formed to be a stack structure of various conductors. Alternatively, the first conductive film 271 may be formed as a single film. The second conductive film 272 may include metal, e.g., tungsten. However, exemplary embodiments are not limited to the example given above.

A second capping film 292 may be formed on the second conductive film 272. The second capping film 292 may entirely cap the second conductive film 272. The second capping film 292 may include an insulator. For example, the second capping film 292 may be any one of silicon nitride, silicon oxide, and silicon oxynitride. However, exemplary embodiments are not limited to the example given above.

The second gate spacer 302 may be formed on both sides of the second gate insulating film 232, the second gate electrode 282, and the second capping film 292. As exemplified in the drawings, the second gate spacer 302 may be a single film, but it may be multiple spacers in which a plurality of films are stacked. A shape of the second gate spacer 302 and a shape of each of the multiple spacers forming the second gate spacer 302 may be I- or L-shape, or a combination thereof depending on the fabrication process and use.

The first sealing film 150 and the second sealing film 160 may be completely removed. Further, the filling spacer 190s may be completely removed. Accordingly, the substrate 100 of the first region R1 may also be exposed as in the second region R2.

An interlayer insulating film 210 may be formed on an exposed upper surface of the substrate 100 in the first region R1 and the second region R2. The interlayer insulating film 210 may also be formed on the first gate electrode 281, the second gate electrode 282, the first gate spacer 301, and the second gate spacer 302. However, as illustrated in the drawings, the interlayer insulating film 210 may be formed only on side surfaces of the first gate electrode 281, the second gate electrode 282, the first gate spacer 301, and the second gate spacer 302, through the planarization process.

As a result, the p-type transistor of a stack structure may be formed on the p-type region Rp, and the n-type transistor of a stack structure may be formed on the n-type region Rn. At this time, the p-type transistor may use the conductive channel region 220 of silicon germanium as a channel region, and the n-type transistor may use the silicon region of the substrate 100 as a channel region.

The method for fabricating a semiconductor device according to some exemplary embodiments may include filling the first undercut 180 with the filling spacer 190s, thereby preventing metal material, e.g., portion of the metal film 250, from remaining in the first undercut 180 in a subsequent progress. Accordingly, a semiconductor device having higher reliability and improved operating performance may be provided.

Hereinbelow, a semiconductor device according to some exemplary embodiments will be described with reference to FIGS. 1 to 7 and 11 to 20. In the following description, description overlapping with the exemplary embodiments already provided above will not be described or described as briefly as possible for the sake of brevity.

Figure 19:
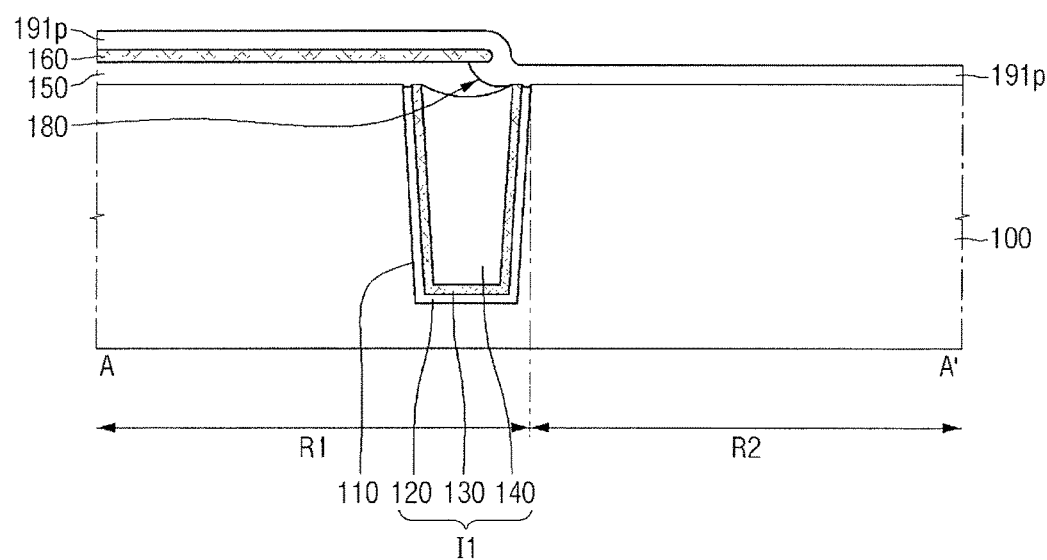
FIGS. 19 and 20 illustrate views of intermediate stages in a method for fabricating a semiconductor device according to some exemplary embodiments.
Figure 20:
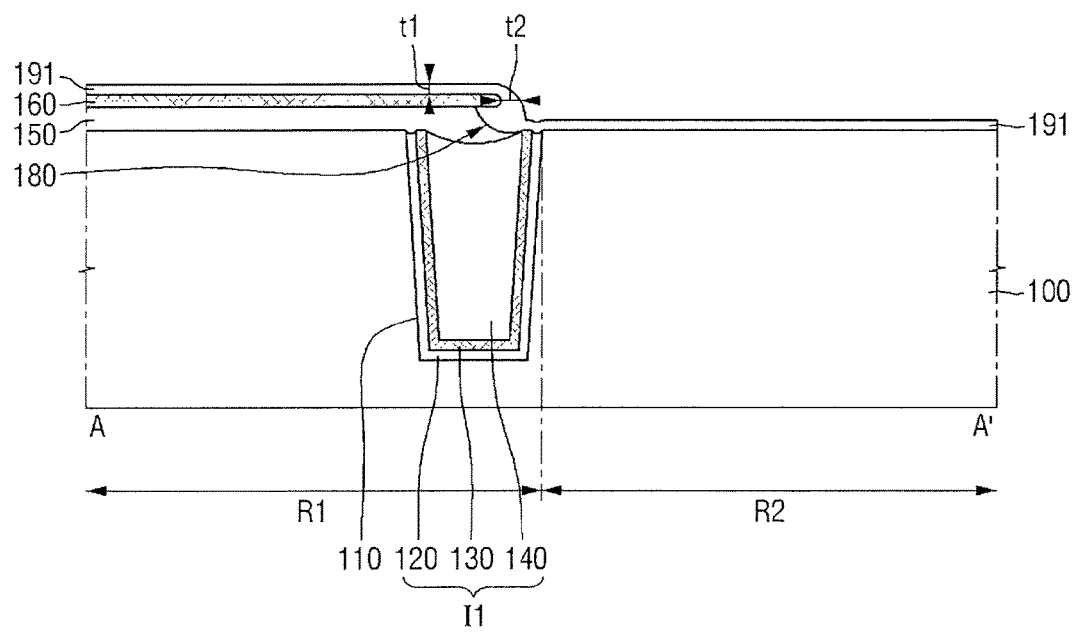

FIGS. 19 and 20 are views illustrating intermediate stages in a method for fabricating a semiconductor device according to some exemplary embodiments.

First, the method for fabricating a semiconductor device according to some exemplary embodiments may be performed according to the stages described previously with reference to FIGS. 1 to 7. Next, referring to FIG. 19, a pre filling film 191p may be formed.

In detail, the pre filling film 191p may be formed along an upper surface and a side surface of the second sealing film 160, a side surface of the pre sealing film, and the substrate 100 of the second region R2.

The pre filling film 191p may be formed along a bottom surface of the first undercut 180, and the pre filling film 191p may entirely fill the first undercut 180. Further, the pre filling film 191p may entirely cover an upper surface, a side surface and a lower surface of the second sealing film 160. For this purpose, the pre filling film 191p may include a material having a good gap-fill capability. For example, the pre filling film 191p may include silicon oxide.

The pre filling film 191p may play a role of a buffer layer of the conductive channel region 220 to be formed later in the p-type region (Rp of FIG. 11) of the second region R2 to be formed later.

The pre filling film 191p may be formed to be thicker compared to the first filling film 190 of FIG. 8. Accordingly, the second filling film 200 of FIG. 9 may not be necessarily deposited again. That is, because the first undercut 180 may be entirely filled with the pre filling film 191p, additional formation of the film may not be required.

Next, referring to FIG. 20, a filling film 191 is formed by etching a portion of the pre filling film 191p.

The filling film 191 may be formed as a portion of the pre filling film 191p is etched. In an example, a portion of the pre filling film 191p may be etched by the anisotropic dry etch. However, exemplary embodiments are not limited to the example given above.

The filling film 191 may still fill the first undercut 180. With the filling film 191, a thickness of the filling film 191 formed on an upper surface of the second sealing film 160 may be a first thickness t1, and a thickness of the filling film 191 formed on a side surface of the second sealing film 160 may be a second thickness t2. In this case, the first thickness t1 may be smaller than the second thickness t2. The subsequent process may be identical to the embodiments of FIGS. 11 to 18 described above.

The method for fabricating a semiconductor device according to some exemplary embodiments initially forms a thick pre filling film 191p, thus eliminating a need for a double structure with respect to a structure of the filling film 191. Accordingly, process efficiency can be enhanced while process waste is eliminated.

Hereinbelow, a semiconductor device according to some exemplary embodiments will be described with reference to FIGS. 1 to 5, 14 to 18, and 21 to 25. In the following description, description overlapping with the exemplary embodiments already provided above will not be described or described as briefly as possible for the sake of brevity.

Figure 21:
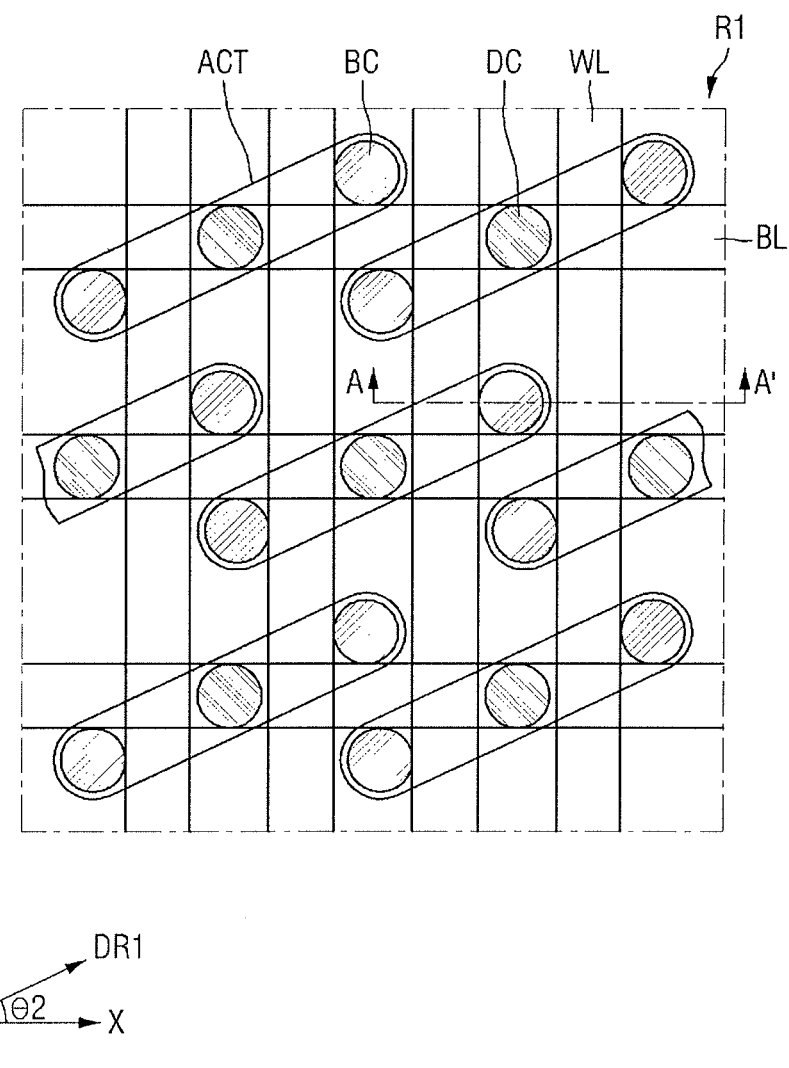
FIGS. 21 to 25 illustrate views of intermediate stages in a method for fabricating a semiconductor device according to some exemplary embodiments.

FIGS. 21 to 25 are views illustrating intermediate stages in a method for fabricating a semiconductor device according to some exemplary embodiments. In an example, FIG. 21 is a layout view provided to explain the first region R1. Line A-A' of FIG. 21 corresponds to a cutting line of the first region R1 of FIGS. 22 to 25.

The method for fabricating a semiconductor device according to some exemplary embodiments may have similar stages as the stages of FIGS. 1 to 5 of the embodiments described above. Meanwhile, when the first device isolation insulating film I1 is formed, a second device isolation insulating film 12 may be formed together.

Figure 22:
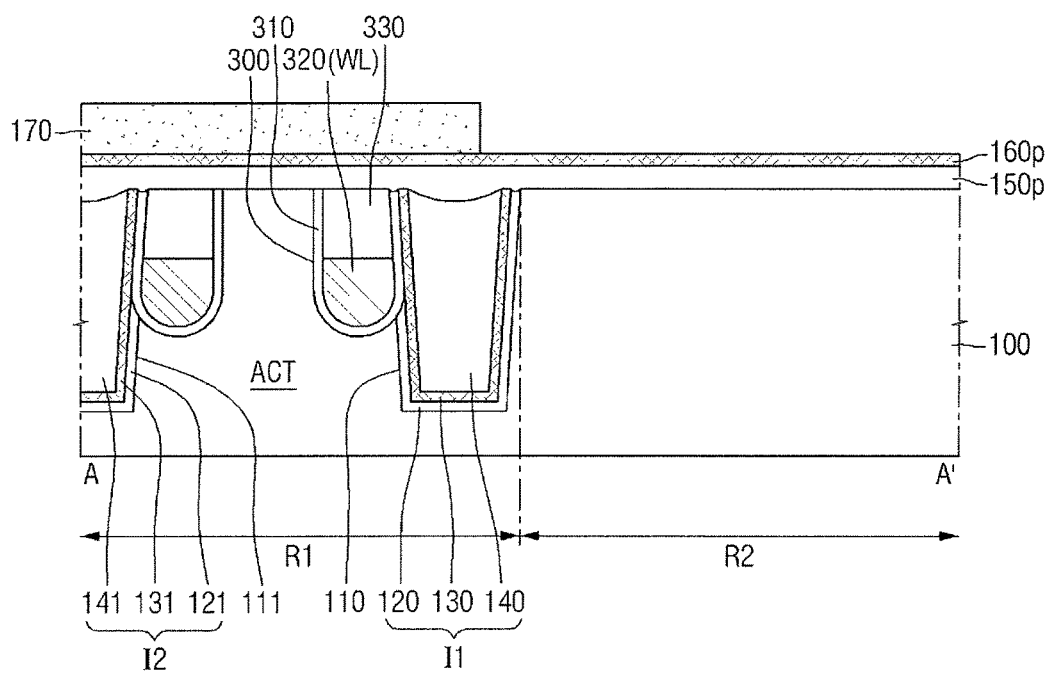

Referring to FIGS. 21 and 22, in the second device isolation insulating film 12, a fourth insulating film 121, a fifth insulating film 131, and a sixth insulating film 141 may be formed on a second device isolation trench 111, in a same structure as the first device isolation insulating film I1.

According to formation of the first device isolation insulating film I1 and the second device isolation insulating film 12, an active region (ACT) may be defined. That is, the first device isolation insulating film I1 and the second device isolation insulating film 12 may form one structure, in which both are actually connected.

Referring to FIG. 21, the first region R1 may include a word line (WL), a bit line (BL), a storage node contact (BC), and a bit line contact (DC).

The active region (ACT) may be formed by extending in a fourth direction DR1, and the word line (WL) may be formed by extending in the second direction Y at an acute angle with respect to the fourth direction DR1. The bit line (BL) may be formed by extending in the first direction X at an acute angle with respect to the fourth direction DR1.

As used herein, the "angle" in the "certain direction is at a predetermined angle with a certain different direction" refers to a smaller angle when two angles are formed between two directions intersecting each other. For example, the "angle" refers to 60°, when 120° and 60° are the angles that can be made between two intersecting directions. Accordingly, as illustrated in FIG. 8, an angle between the fourth direction DR1 and the second direction Y is θ1, and an angle between the fourth direction DR1 and the first direction X is θ2.

The reason for θ1 and/or θ2 forming an acute angle is to increase integration of the memory cell. That is, while reducing a size of the active region (ACT), a pitch between the bit line (BL), the active region (ACT), and the storage node contact (BC) connecting a capacitor (not illustrated) can be ensured. For example, θ1 and θ2 may each be 45° and 45°, or 30° and 60°, or 60° and 30°, but not limited hereto.

The semiconductor device according to some exemplary embodiments may be a form of the memory cell. Although FIG. 22 illustrates the DRAM cell as one example of the memory cell, the present disclosure is not limited hereto.

Referring to FIG. 22, a buried gate trench 300 may be formed within the substrate 100 of the first region R1. The buried gate trench 300 may be in contact with the first device isolation insulating film I1 and the second device isolation insulating film 12. The buried gate trench 300 may be formed by etching a portion of the first insulating film 120 and the fourth insulating film 121, but is not limited hereto.

A buried gate insulating film 310 may be formed along a bottom surface and a side surface of the buried gate trench 300. The buried gate insulating film 310 may include at least one of, e.g., silicon oxide, silicon nitride, silicon oxynitride, or a high-k dielectric material. For example, the high-k dielectric material may include $HfO_2$, $HfSiO_4$, $HfAlO$, $ZrO_2$, $ZrSiO_4$, $TaO_2$, $Ta_2O_5$, and $Al_2O_3$, but is not limited hereto.

A buried gate electrode 320 may fill a portion of the buried gate trench 300 on the buried gate insulating film 310.

The buried gate electrode 320 may include a conductive material, e.g., tungsten or TiN. The buried gate electrode 320 may be formed to be a multi-layered film in which each of the aforementioned materials are included. At this time, the buried gate electrode 320 may be a same constituent element as the word line (WL).

A buried gate capping film 330 may entirely fill the buried gate trench 300. The buried gate capping film 330 may be formed on the buried gate electrode 320. At this time, the buried gate insulating film 310 may be formed on a side surface of the buried gate capping film 330.

A buried cell array transistor (BCAT) may be formed as a structure of the buried gate trench 300, the buried gate insulating film 310, the buried gate electrode 320, and the buried gate capping film 330.

Next, the first pre sealing film 150p, the second pre sealing film 160p, and the barrier film 170 may be formed.

First, the first pre sealing film 150p may be formed on upper surfaces of the first region R1 and the second region R2 of the substrate 100. Further, the first pre sealing film 150p may also be formed on the first device isolation insulating film I1.

Next, the second pre sealing film 160p may be formed on the first pre sealing film 150p along the upper surface of the first pre sealing film 150p. The second pre sealing film 160p on the first pre sealing film 150p may entirely cover the first region R1 and the second region R2 of the substrate 100.

The first pre sealing film 150p and the second pre sealing film 160p may have different materials from each other. The first pre sealing film 150p and the second pre sealing film 160p may have different etch selectivities in the etch process to be described below.

Next, the barrier film 170 may be formed on an upper surface of the second pre sealing film 160p. The barrier film 170 may be formed only on the first region R1 and may expose the second region R2 of the substrate 100. The barrier film 170 may be formed to cover at least a portion of the first device isolation insulating film I1. Accordingly, an end of the barrier film 170 may overlap an upper surface of the first device isolation insulating film I1.

The barrier film 170 may be a material with a considerably low etch selectivity with respect to all of the first pre sealing film 150p and the second pre sealing film 160p. While the first pre sealing film 150p and the second pre sealing film 160p of the second region R2 are removed by a subsequent etch process, the barrier film 170 may protect the first pre sealing film 150p and the second pre sealing film 160p of the first region R1.

Figure 23:
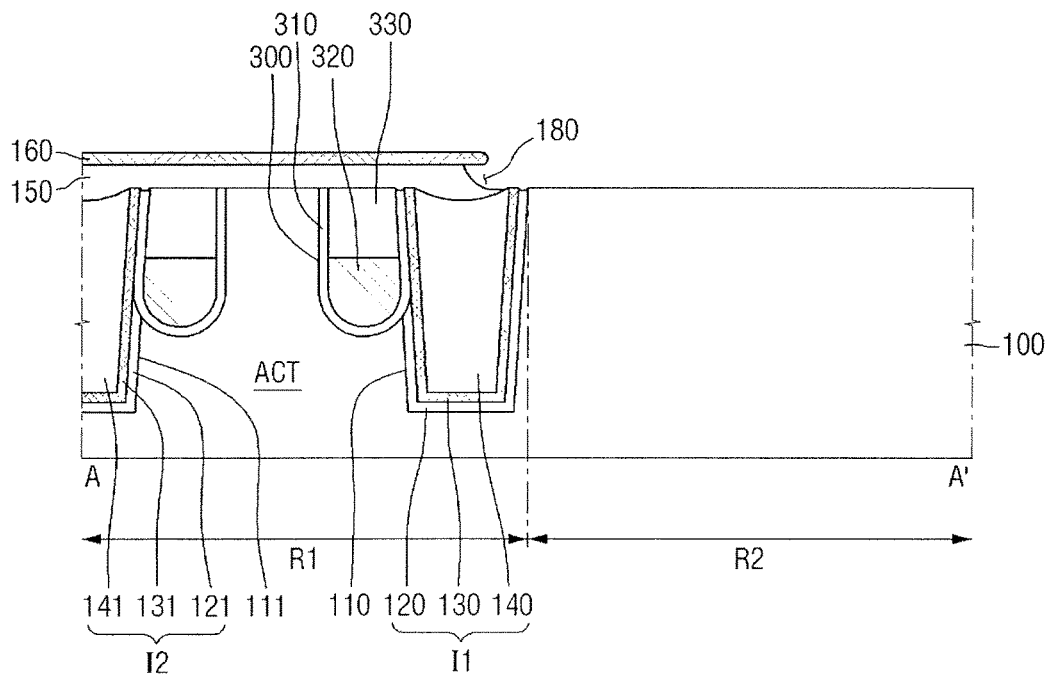

Next, referring to FIG. 23, the first sealing film 150 and the second sealing film 160 are formed by removing a portion of the first pre sealing film 150p and the second pre sealing film 160p.

A portion of the first pre sealing film 150p and the second pre sealing film 160p may be removed by using the barrier film 170 as a mask. By doing so, the first pre sealing film 150p may be formed into the first sealing film 150 and the second pre sealing film 160p may be formed into the second sealing film 160.

The first sealing film 150 and the second sealing film 160 may cover an upper surface of the first region R1 of the substrate 100, while exposing an upper surface of the second region R2. Accordingly, the first sealing film 150 and the second sealing film 160 may perform sealing of the first region R1.

Meanwhile, the first undercut 180 may be formed under the second sealing film 160 and on a side surface of an end of the first sealing film 150. A portion of the lower portion of the second sealing film 160 may be exposed with the first undercut 180. Meanwhile, the barrier film 170 may be removed.

Figure 24:
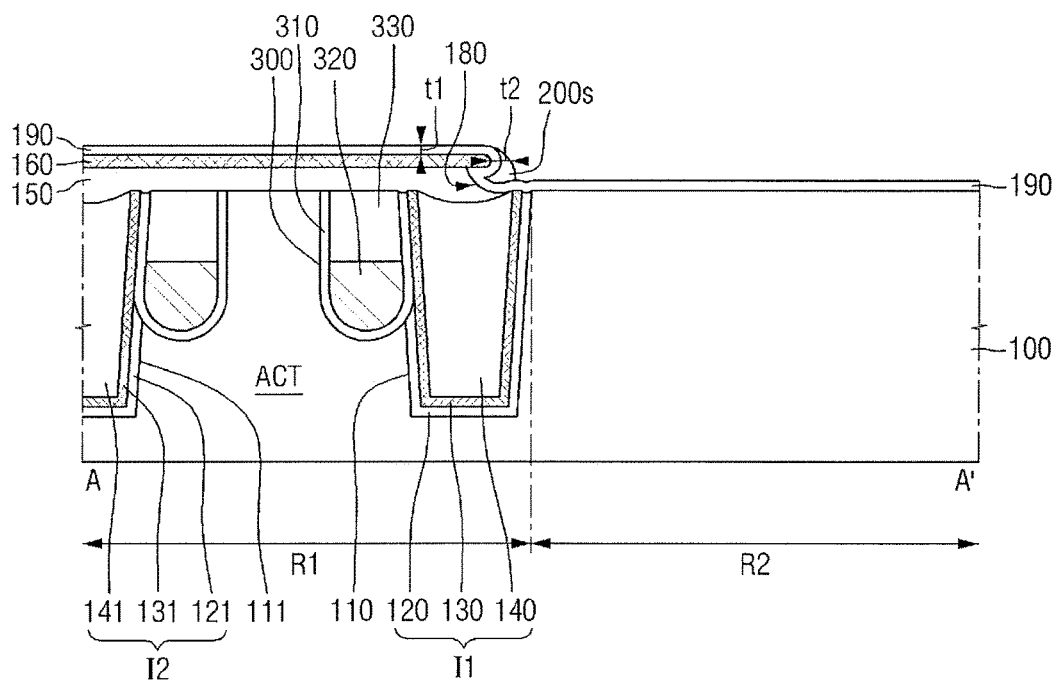

Next, referring to FIG. 24, the first filling film 190 and the pre filling spacer 200s may be formed.

The first filling film 190 may be formed along a bottom surface of the first undercut 180. Accordingly, the first filling film 190 may fill at least a portion of the first undercut 180.

The pre filling spacer 200s may fill the first undercut 180. With the pre filling spacer 200s, a thickness of the filling film formed on an upper surface of the second sealing film 160 may be a first thickness t1, and a thickness of the filling film formed on a side surface of the second sealing film 160 may be a second thickness t2. In this case, the first thickness t1 may be smaller than the second thickness t2.

Figure 25:
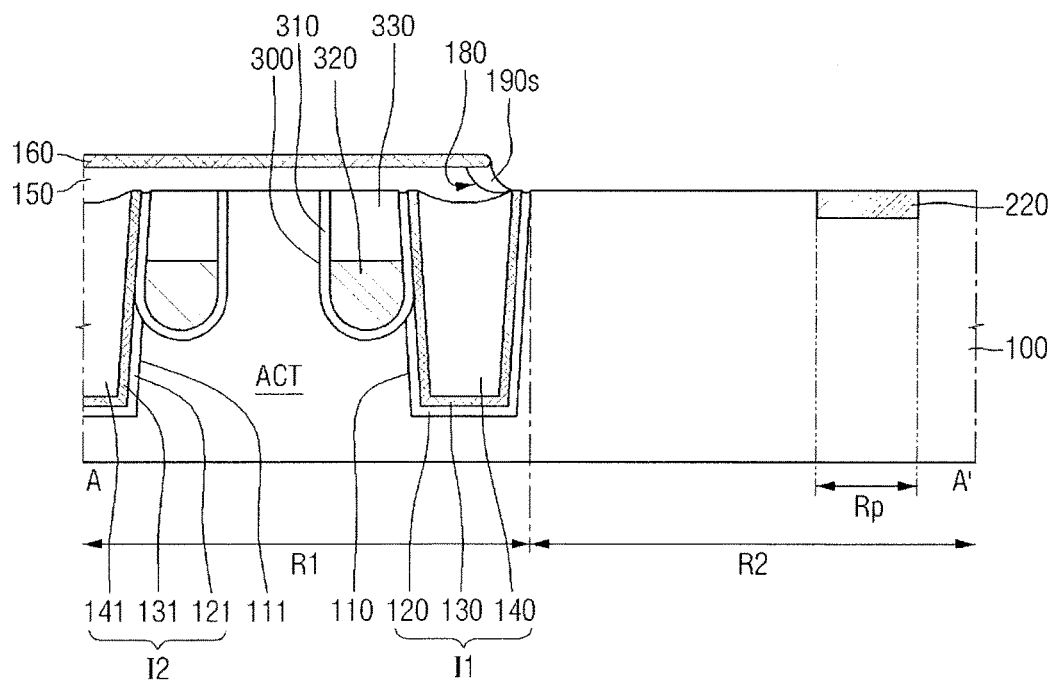

Next, referring to FIG. 25, the filling spacer 190s and the conductive channel region 220 are formed. The filling spacer 190s may fill the first undercut 180. The filling spacer 190s may be an unremoved portion of the first filling film 190. The filling spacer 190s may cover all of a lower surface and a portion of a side surface of the second sealing film 160, and a side surface of the first sealing film 150. This shape of the filling spacer 190s may prevent a material formed later from being remained.

The conductive channel region 220 may be formed to be a SiGe layer by the epitaxial growth while consuming silicon in the p-type region Rp. The conductive channel region 220 may be formed to form a p-type transistor. The conductive channel region 220 may include, e.g., silicon germanium. A subsequent process may be identical or similar to the embodiments described above with reference to FIGS. 14 to 18.

Hereinbelow, a semiconductor device according to some exemplary embodiments will be described with reference to FIGS. 1 to 5, 14 to 18, 21 to 23, and 26 to 28. In the following description, description overlapped with the exemplary embodiments already provided above will not be described or described as briefly as possible for the sake of brevity.

Figure 26:
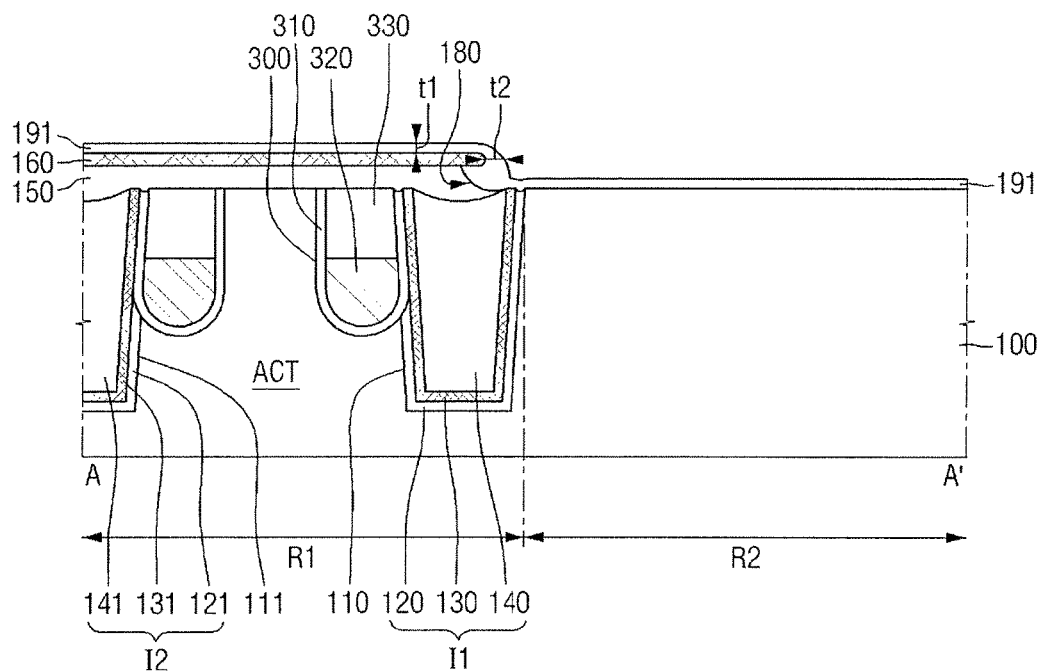
FIGS. 26 to 28 illustrate views of intermediate stages in a method for fabricating a semiconductor device according to some exemplary embodiments.
Figure 27:
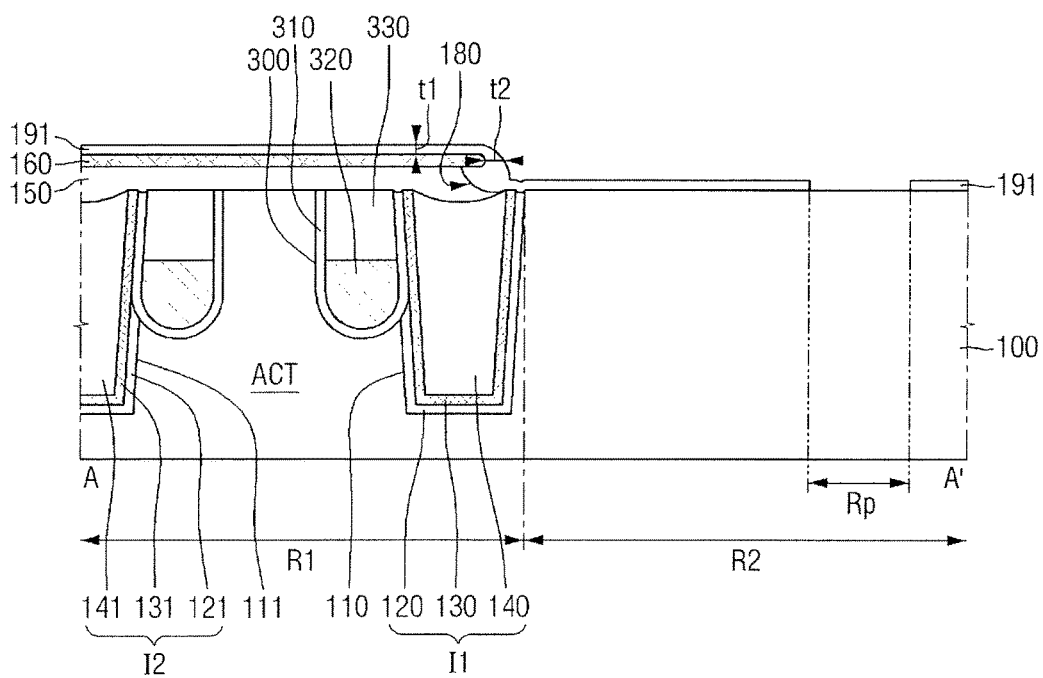
Figure 28:
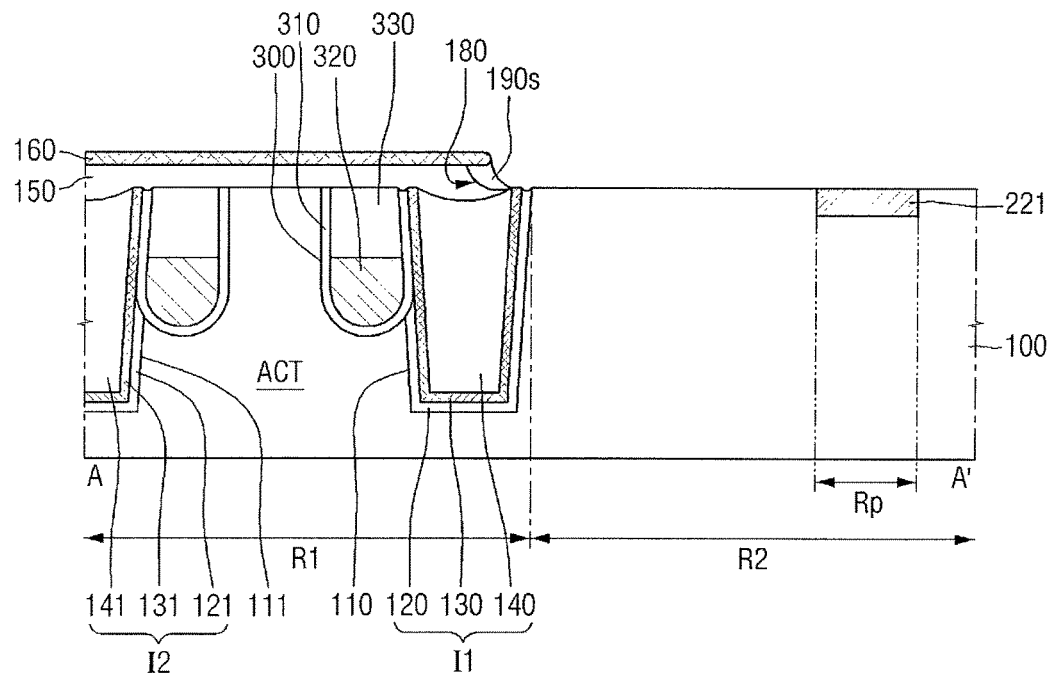

FIGS. 26 to 28 are views illustrating intermediate stages in a method for fabricating a semiconductor device according to some exemplary embodiments. The method for fabricating a semiconductor device according to some exemplary embodiments may have similar stages as the stages of FIGS. 1 to 5 and 21 to 23 of the embodiments described above.

Referring to FIG. 26, the filling film 191 is formed. The filling film 191 may still fill the first undercut 180. With the filling film 191, a thickness of the filling film 191 formed on an upper surface of the second sealing film 160 may be the first thickness t1, and a thickness of the filling film 191 formed on a side surface of the second sealing film 160 may be the second thickness t2. In this case, the first thickness t1 may be smaller than the second thickness t2. That is, after the thick pre filling film is formed, the first undercut 180 may be filled, and the filling film 191 may be formed through the etch process.

Next, referring to FIG. 27, the filling film 191 is removed from the p-type region Rp of the second region R2 of the substrate 100. With removal of the filling film 191, the p-type region Rp of the second region R2 of the substrate 100 may be exposed.

Next, referring to FIG. 28, the filling spacer 190s and the conductive channel region 221 may be formed.

The conductive channel region 221 may be formed on the p-type region Rp of the exposed second region R2. The conductive channel region 221 may be formed to form a p-type transistor. The conductive channel region 221 may be formed to include silicon germanium while consuming silicon with the epitaxial growth.

The filling spacer 190s may be a part remained when a portion of the first filling film 190 is removed by the wet etch. The filling spacer 190s may fill the first undercut 180. The filling spacer 190s may cover all of a lower surface and a portion of a side surface of the second sealing film 160, and a side surface of the first sealing film 150. Such form of the filling spacer 190s may prevent a material formed later from being remained. The subsequent process may be identical or similar to the embodiments described above with reference to FIGS. 14 to 18.

Hereinbelow, a semiconductor device according to some exemplary embodiments will be described with reference to FIGS. 1 to 6, 14 to 18, and 29 to 34. In the following description, description overlapped with the exemplary embodiments already provided above will not be described or described as briefly as possible for the sake of brevity.

Figure 32:
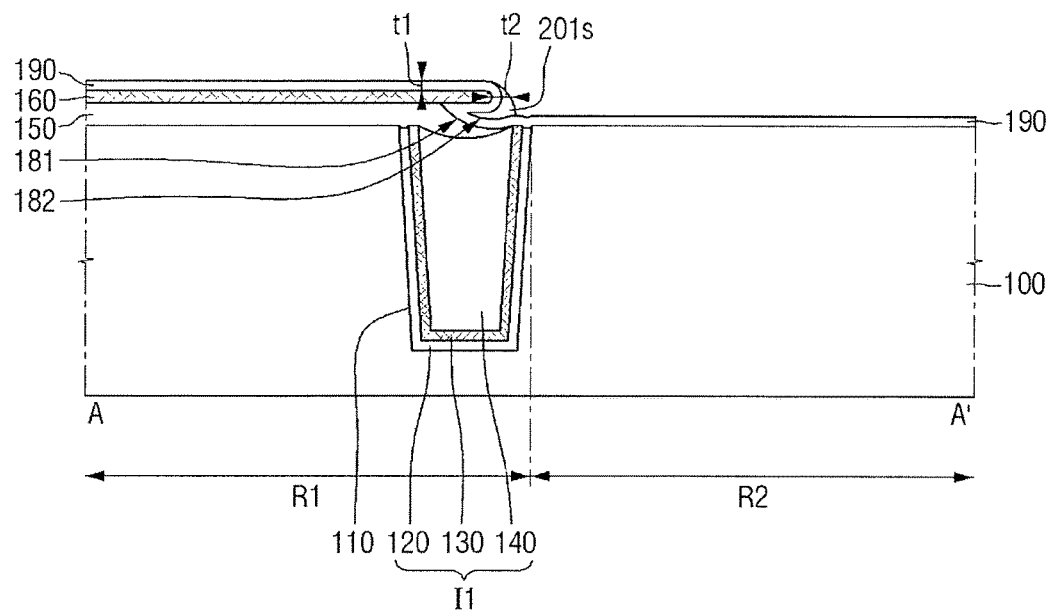
Figure 33:
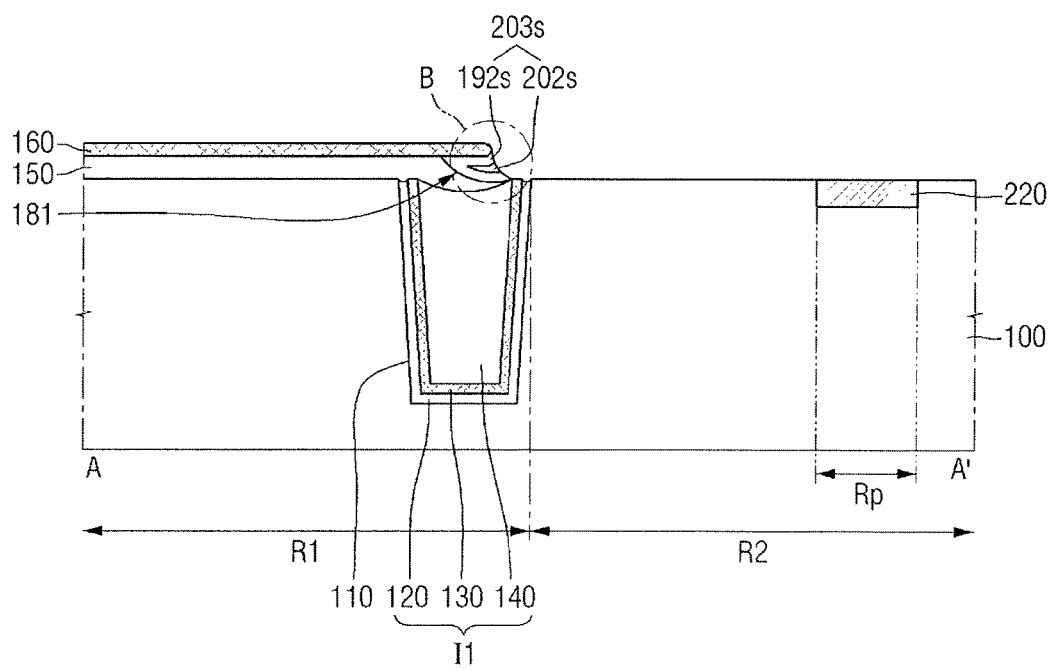
Figure 34:
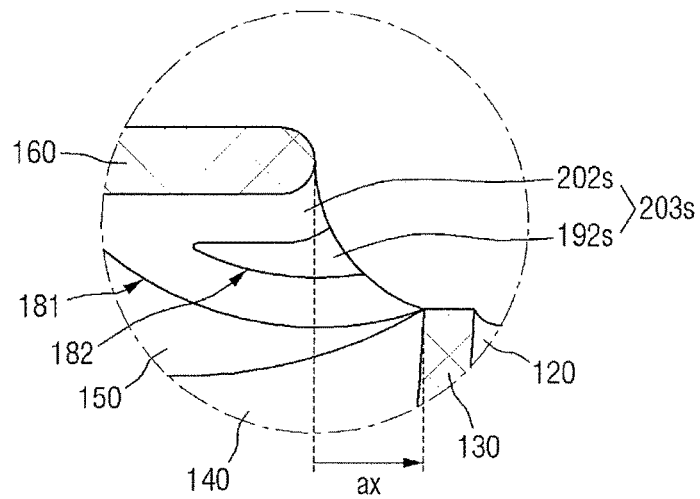

FIGS. 29 to 34 are views illustrating intermediate stages in a method for fabricating a semiconductor device according to some exemplary embodiments. FIG. 34 is an enlarged cross-sectional view of the encircled section B of FIG. 33. The method for fabricating a semiconductor device according to some exemplary embodiments may have similar stages as the stages of FIGS. 1 to 6 of the embodiments described above.

Figure 29:
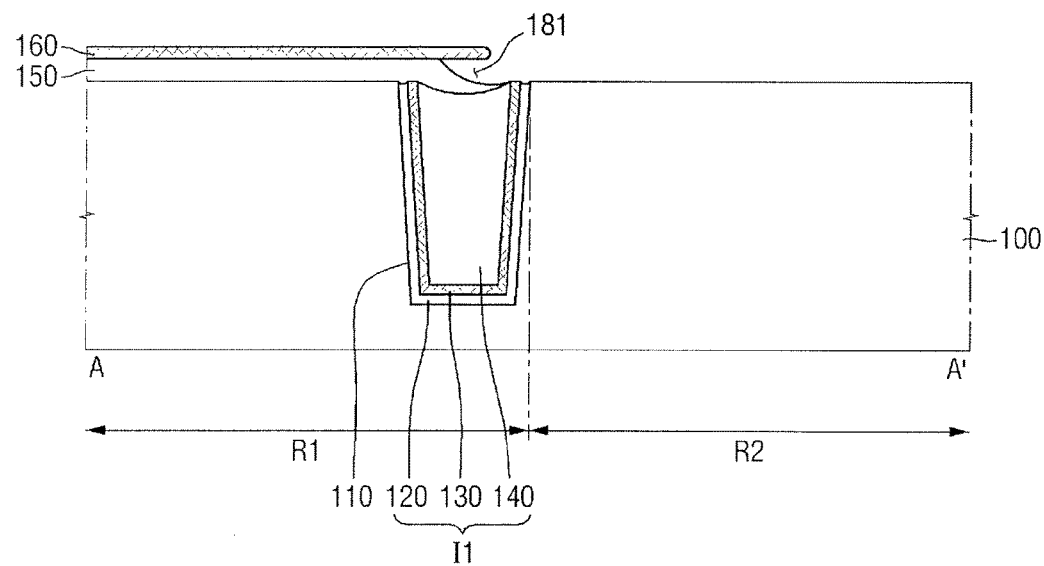
FIGS. 29 to 34 illustrate views of intermediate stages in a method for fabricating a semiconductor device according to some exemplary embodiments.

Referring to FIG. 29, the first sealing film 150 and the second sealing film 160 may be formed by removing a portion of the first pre sealing film 150p and the second pre sealing film 160p. Because etch selectivity is different in the second sealing film 160 and the first sealing film 150, the first undercut 181 may be formed under the second sealing film 160 and on a side surface of an end of the first sealing film 150. A portion of the lower portion of the second sealing film 160 may be exposed by the first undercut 181.

Figure 30:
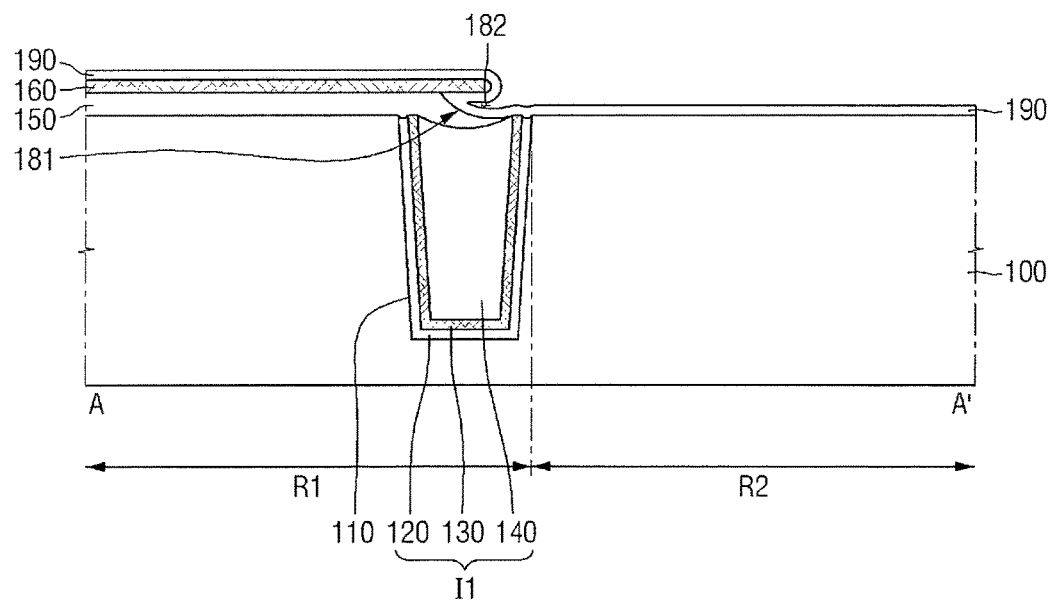

Next, referring to FIG. 30, the first filling film 190 is formed. The first filling film 190 is formed along an upper surface and a side surface of the second sealing film 160, a side surface of the first sealing film 150, and the substrate 100 of the second region R2.

The first filling film 190 may be formed along a bottom surface of the first undercut 181. Accordingly, the first filling film 190 may fill a portion of the first undercut 181. The first filling film 190 may include a material having a good gap-fill capability. For example, the first filling film 190 may include silicon oxide.

Because the first undercut 181 is not completely filled, a second undercut 182 may be formed. The second undercut 182 may be an indented portion in the direction from the second region R2 to the first region R1.

Figure 31:
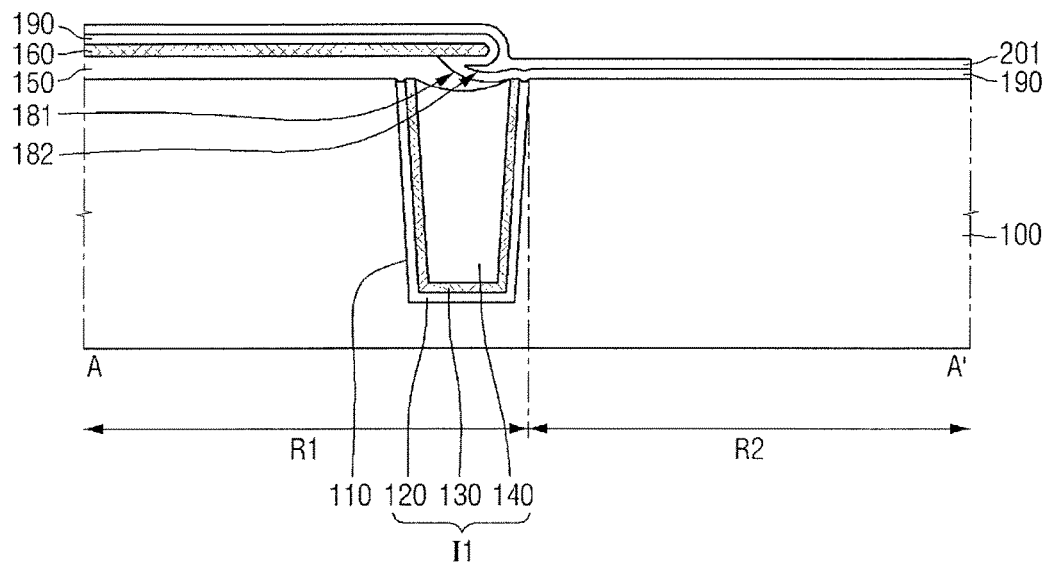

Next, referring to FIG. 31, the second filling film 200 is formed. The second filling film 200 may be formed along an upper surface of the first filling film 190. The second undercut 182 may be entirely filled with the second filling film 200.

Next, referring to FIG. 32, the pre filling spacer 201s is formed. The second filling film 200 may be etched to form the pre filling spacer 201s. The second filling film 200 may be entirely removed except for the pre filling spacer 201s and a channel region spacer 200p. However, exemplary embodiments are not limited to the example given above.

The pre filling spacer 201s may fill the second undercut 182. With the pre filling spacer 201s, a thickness of the filling film formed on an upper surface of the second sealing film 160 may be a first thickness t1, and a thickness of the filling film formed on a side surface of the second sealing film 160 may be a second thickness t2. In this case, the first thickness t1 may be smaller than the second thickness t2.

Next, referring to FIGS. 33 and 34, the filling spacer 203s and the conductive channel region 220 are formed. The conductive channel region 220 may be formed on the p-type region Rp of the second region R2. The filling spacer 203s may fill the first undercut 181 and the second undercut 182. In detail, the filling spacer 203s may include a first portion 192s filling a portion of the first undercut 181 and a second portion 202s filling the second undercut 182.

The first portion 192s may be an unremoved portion of the first filling film 190. The second portion 202s may be an unremoved portion of the second filling film 200. The filling spacer 203s may cover all of a lower surface and a portion of a side surface of the second sealing film 160, and a side surface of the first sealing film 150.

Although drawings illustrate that the filling spacer 203s does not cover upper surfaces of the second insulating film 130 and the third insulating film 140, exemplary embodiments are not limited thereto. The position of the filling spacer 190s may not be limited as long as it fills the first undercut 181 and the second undercut 182.

The subsequent process may be identical or similar to the embodiments described above of FIGS. 14 to 18.

Hereinbelow, a semiconductor device according to some exemplary embodiments will be described with reference to FIGS. 1 to 5, 14 to 17, 21 to 25 and 35. In the following description, description overlapped with the exemplary embodiments already provided above will not be described or described as briefly as possible for the sake of brevity.

Figure 35:
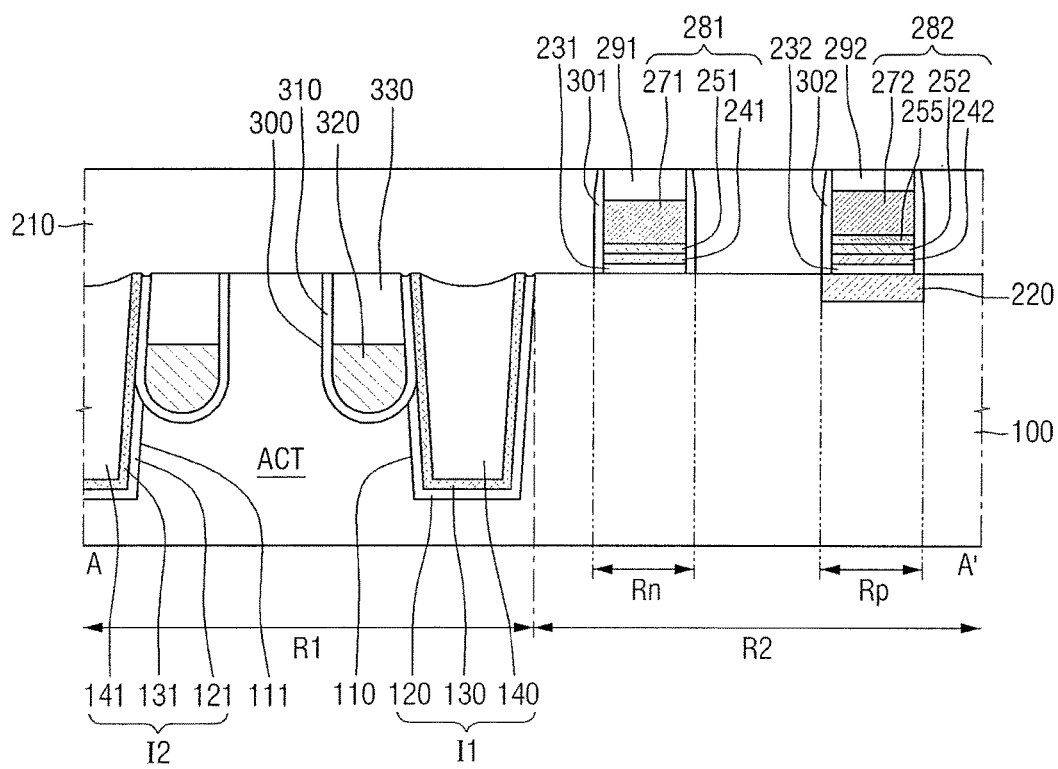
FIG. 35 illustrates a view of an intermediate stage in a method for fabricating a semiconductor device according to some exemplary embodiments.

FIG. 35 is a view illustrating an intermediate stage in a method for fabricating a semiconductor device according to some exemplary embodiments. The method for fabricating a semiconductor device according to some exemplary embodiments may have similar stages as the stages of FIGS. 1 to 5, 21 to 25 and 14 to 17 of the embodiments described above.

Referring to FIG. 35, the second gate electrode 282 may additionally include a third metal film 255 between the second metal film 252 and the second conductive film 272. The third metal film 255 may adjust work functions of the p-type transistor along with the second metal film 252. That is, the n-type transistor may use the second metal film 252 as an work function adjustment film in the n-type region Rn, and the p-type transistor may use the third metal film 255, along with the second metal film 252, as the work function adjustment film in the p-type region Rp.

As a result, the first region R1 may be formed with the buried gate structure including the buried gate electrode 320, and the second region R2 may be formed with the stack gate structure including the first gate electrode 281 and the second gate electrode 282.

Hereinbelow, a semiconductor device according to some exemplary embodiments will be described with reference to FIGS. 1 to 5, 14 to 17, 21 to 25, and 36. In the following description, description overlapped with the exemplary embodiments already provided above will not be described or described as briefly as possible for the sake of brevity.

Figure 36:
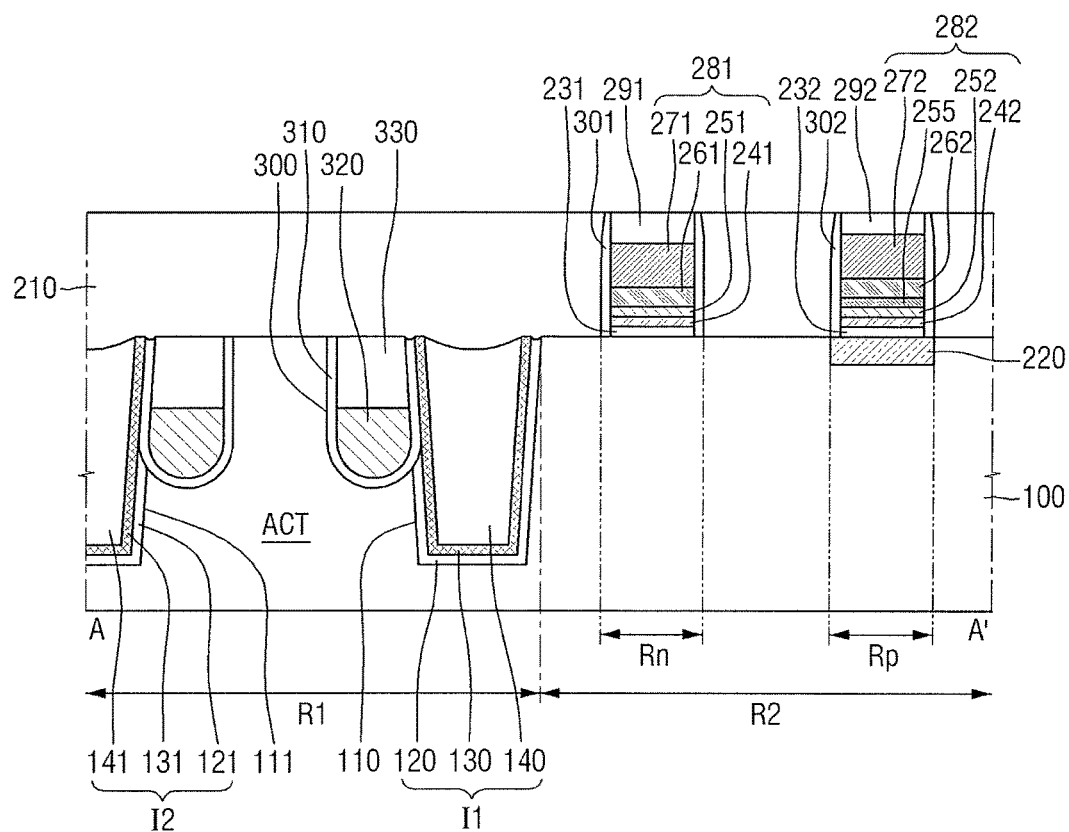
FIG. 36 illustrates a view of an intermediate stage in a method for fabricating the semiconductor device according to some exemplary embodiments.

FIG. 36 is a view illustrating an intermediate stage in a method for fabricating the semiconductor device according to some exemplary embodiments. The method for fabricating a semiconductor device according to some exemplary embodiments may have similar stages as the stages of FIGS. 1 to 5, 21 to 25 and 14 to 11 of the embodiments described above.

Referring to FIG. 36, a first poly film 261 may be formed between the first metal film 251 and the first conductive film 271, and a second poly film 262 may be formed between the second metal film 252 and the second conductive film 272. The first poly film 261 and the second poly film 262 may both include poly silicon. As a result, the work function adjustment film, the poly film and the conductive metal film may be formed. As a result, the device can be formed with more enhanced operating characteristic because resistance characteristic of the gate electrode structure and work function adjustment characteristic can be subdivided.

By way of summation and review, due to etch selectivity of a heterojunction interface. e.g., in a DRAM device, an undercut region may occur by a cleaning or etching process. When a material such as polysilicon (poly Si) is applied in the undercut region, some of the polysilicon may remain in the undercut after a subsequent etch process along an undercut line. When a material such as metal is applied in the undercut, a metal residue may remain in the undercut region and cause contamination when performing a subsequent process.

In contrast, embodiments provide a method for fabricating a semiconductor device with improved operating characteristics. That is, according to embodiments, a spacer is formed in the undercut region to act as a filler, thereby preventing a HKMG material used in a subsequent process from remaining in the undercut area during the subsequent process. Removal of the HKMG material eliminates the undercut region and prevents metallic residue and contamination in subsequent processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   providing a substrate including a first region and a second region;
   forming a device isolation insulating film between the first region and the second region;
   forming a first sealing film on the substrate;
   forming a second sealing film on the first sealing film, such that an etch selectivity of the second sealing film is smaller than that of the first sealing film;
   patterning the first and second sealing films to expose all of the second region and a portion of the device isolation insulating film, the first sealing film being removed more than the second sealing film to define an undercut region on a lower portion of the second sealing film;
   forming a filling film filling the undercut region and covering the first and second regions, a thickness of the filling film being thicker on a side surface of the second sealing film than on an upper surface of the second sealing film;
   forming a filling spacer filling the undercut region by removing a portion of the filling film from the second region and from the side and upper surfaces of the second sealing film in the first region, such that a remainder of the filling film remains in the undercut region below the second sealing film;
   forming a high-k dielectric film and a metal film on the filling spacer; and
   removing the high-k dielectric film and the metal film.

2. The method as claimed in claim 1, wherein forming the filling film includes forming a first filling film filling the undercut region and covering the first and second regions, and forming a second filling film on the first filling film.

3. The method as claimed in claim 2, wherein forming the filling spacer includes:
   removing a portion of the second filling film to form a pre filling spacer on the first filling film; and
   etching the pre filling spacer and the first filling film to form the filling spacer in the undercut region.

4. The method as claimed in claim 1, wherein the second region surrounds the first region.

5. The method as claimed in claim 1, further comprising forming a device isolation trench to accommodate the device isolation insulating film,
   wherein the device isolation insulating film includes a device isolation liner formed along a bottom surface and a side surface of the device isolation trench, and a device isolation film on the device isolation liner filling the device isolation trench.

6. The method as claimed in claim 5, wherein the device isolation liner includes first and second device isolation liners, the first device isolation liner is in contact with a bottom surface and a side surface of the device isolation trench, and the second device isolation liner is formed on the first device isolation liner.

7. The method as claimed in claim 6, wherein the first device isolation liner includes silicon oxide, and the second device isolation liner includes silicon nitride.

8. The method as claimed in claim 1, wherein the first sealing film includes a silicon oxide film, and the second sealing film includes a silicon nitride film.

9. The method as claimed in claim 1, further comprising forming a buried cell array transistor (BCAT) on the first region.

10. The method as claimed in claim 1, further comprising forming a gate insulating film on the filling spacer, such that the high-k dielectric film is formed on the gate insulating film.

11. The method as claimed in claim 1, wherein:
   the first and second regions of the substrate are formed as a cell array region and a periphery region, respectively, such that the substrate includes a buried gate structure on the cell array region;
   the undercut region is formed under the second sealing film on a side surface of the first sealing film; and
   a gate insulating film, the high-k dielectric film, and the metal film are formed sequentially and conformally on the cell array region, on the periphery region, and on the filling spacer; and
   a stack gate structure is formed on the periphery region by patterning the gate insulating film, the high-k dielectric film, and the metal film, such that the high-k dielectric film and the metal film on the cell array region and on the filling spacer are completely removed.

12. The method as claimed in claim 11, wherein the buried gate structure includes a buried gate trench formed on the cell array region of the substrate, a buried gate insulating film formed along a bottom surface and a side surface of the buried gate trench, a buried gate electrode formed on the buried gate insulating film and filling a portion of the buried gate trench, and a capping film formed on the buried gate electrode and entirely filling the buried gate trench.

13. The method as claimed in claim 12, wherein upper surfaces of the capping film and the buried gate insulating film are in contact with the first sealing film.

14. The method as claimed in claim 11, wherein a profile of the upper surface of the filling spacer corresponds one to one to a straight line extending in a direction from the cell array region to the periphery region.

15. The method as claimed in claim 1, wherein the filling film includes a first filling film and a second filling film formed on the first filling film, and the filling spacer is formed by etching the first and second filling films separately via different etching steps.

16. The method as claimed in claim 1, wherein forming the filling spacer includes having the remainder of the filling film only in the undercut region between the lower portion of the second sealing film and the device isolation insulating film.

17. The method as claimed in claim 1, wherein:
the first and second regions of the substrate are formed as a cell array region and a periphery region, respectively, such that the periphery region includes first and second conductive regions having different conductivity types;
the undercut region is formed on a side surface of the first sealing film and under the second sealing film; and
further comprising exposing the second conductive region by removing a second portion of the filling film;
forming a conductive channel region including a different material from the substrate of the second conductive region; and
forming a gate insulating film on the high-k dielectric film.

18. The method as claimed in claim 17, wherein the first conductive region is an n-type region and the second conductive region is a p-type region.

19. The method as claimed in claim 18, wherein the second conductive region includes silicon germanium (SiGe).

20. The method as claimed in claim 17, wherein an n-type gate structure and a p-type gate structure are formed on the first and second conductive regions, the n-type gate structure including a first gate insulating film, a first high-k dielectric film, a first metal film, a first poly film, and a first conductive film, and the p-type gate structure includes a second gate insulating film, a second high-k dielectric film, a second metal film, a second poly film, and a second conductive film.

* * * * *